United States Patent
Mayer et al.

(10) Patent No.: US 8,476,580 B2
(45) Date of Patent: Jul. 2, 2013

(54) ANGLE-MEASURING DEVICE AND LINE OF PRODUCTS WITH SUCH ANGLE-MEASURING DEVICES

(75) Inventors: Elmar Mayer, Nußdorf (DE); Thomas Schürmann, Rosenheim (DE); Christoph Lingk, Traunstein (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 347 days.

(21) Appl. No.: 12/988,573

(22) PCT Filed: Mar. 12, 2009

(86) PCT No.: PCT/EP2009/001768
§ 371 (c)(1),
(2), (4) Date: Dec. 22, 2010

(87) PCT Pub. No.: WO2009/129891
PCT Pub. Date: Oct. 29, 2009

(65) Prior Publication Data
US 2011/0290888 A1    Dec. 1, 2011

(30) Foreign Application Priority Data

Apr. 23, 2008    (DE) .......................... 10 2008 020 110

(51) Int. Cl.
*G01D 5/34*    (2006.01)
(52) U.S. Cl.
USPC ................................ 250/231.18; 250/231.13
(58) Field of Classification Search
USPC ........................................ 250/231.13–231.18
See application file for complete search history.

(56) References Cited

U.S. PATENT DOCUMENTS
7,612,689 B2 * 11/2009 Neumann et al. ............... 341/11

FOREIGN PATENT DOCUMENTS
| DE | 38 29 545 A1 | 8/1989 |
| JP | 57-175211 A | 10/1982 |
| JP | 2005 061907 A | 3/2005 |

* cited by examiner

*Primary Examiner* — Thanh Luu
(74) *Attorney, Agent, or Firm* — Brinks Hofer Gilson & Lione

(57) ABSTRACT

An angle-measuring device having a scanning device with which scanning of a closed serial first code and scanning of a closed serial second code is enabled, wherein a length of the closed serial second code is less than a length of the closed serial first code, and the closed serial first code and the closed serial second code have at least one common code section. The angle-measuring device includes a detector array for generating first and second sequences of code words of a predetermined scanning length upon scanning of the closed serial first code and second codes, respectively. The first sequence includes a first partial sequence and one common partial sequence, and wherein the common partial sequence is created upon scanning of the common code section. The second sequence includes a second partial sequence and the common partial sequence. The angle-measuring device further includes a decoding device designed for decoding the first and second sequences of code words, wherein the closed serial first and second codes as well as the predetermined scanning length are selected such that code words of the first and second sequences have a Hamming distance greater than 1.

11 Claims, 11 Drawing Sheets

ANGLE-MEASURING DEVICE AND LINE OF PRODUCTS WITH SUCH ANGLE-MEASURING DEVICES

Applicants claim, under 35 U.S.C. §§120 and 365, the benefit of priority of the filing date of Mar. 12, 2009 of a Patent Cooperation Treaty patent application, copy attached, Serial Number PCT/EP2009/001768, filed on the aforementioned date, the entire contents of which are incorporated herein by reference, wherein Patent Cooperation Treaty patent application Serial Number PCT/EP2009/001768 was not published under PCT Article 21(2) in English.

Applicants claim, under 35 U.S.C. §119, the benefit of priority of the filing date of Apr. 23, 2008 of a German patent application, copy attached, Serial Number 10 2008 020 110.3, filed on the aforementioned date, the entire contents of which are incorporated herein by reference.

BACKGROUND OF THE INVENTION

1. Field of the Invention

The present invention relates to an angle-measuring device having a scanning device for scanning a serial code and for outputting decoded words as a position.

The present invention further relates to a line of angle-measuring devices.

2. Description of the Related Art

In many fields, absolute angle measuring instruments are increasingly used for determining the position of two bodies moved relative to one another. Absolute angle measuring instruments have the advantage over purely incrementally measuring systems that in each relative position, even after an interruption of the energy supply, correct position information can immediately be output.

The absolute position is embodied by a code. The disposition of the position information in a single code track with code elements disposed in succession in the measuring direction is especially space-saving. The code elements are disposed in a pseudo-random distribution in succession, so that a certain number of successive code elements each form one code word, which unambiguously defines the absolute position. Upon a shift of the scanning device by one single code element, a new code word is already formed, and a sequence of different code words is available over the entire circumference to be detected in absolute form. A serial or sequential code of this kind is also often called a chain code or a pseudo-random code.

As already explained in Japanese Patent Disclosure JP 57-175211 A, for determining the absolute position from the scanned code words—also called decoding—a decoding table (look-up table) is used, in which each code word is assigned one position. For assigning the absolute position to a scanned code word, the code word forms the address for the decoding table, so that the absolute position stored in memory for this code word is present at the output and is available for further processing.

These nonvolatile tables can today be designed in hard-wired in an ASIC, to make fast access possible. To procure ASICs economically, however, relatively high numbers must be produced per ASIC. The goal is therefore to minimize the great number of variants. The limits for reducing variants are reached especially in angle-measuring devices in which over the entire circumference, in every angular position, one ambiguous absolute position must be output. A client often wants different diameters of the angle-measuring devices to have a different number of absolute positions per revolution.

As a rule, for each diameter a separate ASIC with an individual table, adapted to the individual code, is used for this purpose.

To enable using a scanning device for different diameters of a code disk it is proposed in Japanese Patent Disclosure JP 2005-061907 A that an individual decoding table, in the form of read-only memories (ROMs), with a complete set of values of all the code words to be decoded is provided in the scanning device for each of a plurality of variants. Based on an identification in the form of a selection signal which specifies the code to be scanned, only data from the decoding table individually assigned to that code are used during the decoding. In selecting the code, the point of departure is a generated sequence of unambiguous code words. For angle-measuring devices of smaller diameter, that is, a shorter code length, there is a complete separate decoding table whose code words are a selected section of the existing sequence of code words. The disadvantage of this angle-measuring device is that for the decoding tables and thus for the code, only very special sequences from the generated sequence of code words can be selected, and that the Hamming distance of the code words of the sequences is necessarily 1. Moreover, the space required for the plurality of complete decoding tables is relatively great.

SUMMARY AND OBJECTS OF THE INVENTION

It is therefore an object of the present invention to disclose an angle-measuring device with which standardization for constructing a line of angle-measuring devices is made possible in a simple way.

This object is attained by an angle-measuring device having a scanning device with which scanning of a closed serial first code and scanning of a closed serial second code is enabled, wherein a length of the closed serial second code is less than a length of the closed serial first code, and the closed serial first code and the closed serial second code have at least one common code section. The angle-measuring device includes a detector array for generating first and second sequences of code words of a predetermined scanning length upon scanning of the closed serial first code and second codes, respectively. The first sequence includes a first partial sequence and one common partial sequence, and wherein the common partial sequence is created upon scanning of the common code section. The second sequence includes a second partial sequence and the common partial sequence. The angle-measuring device further includes a decoding device designed for decoding the first and second sequences of code words, wherein the closed serial first and second codes as well as the predetermined scanning length are selected such that code words of the first and second sequences have a Hamming distance greater than 1.

This object is also attained by a line of angle-measuring devices including first and second angle-measuring devices. The first angle-measuring device including a first code medium with a closed serial first code and a scanning device that scans the first code medium. The line of angle measuring devices includes a second angle-measuring device including a second code medium with a closed serial second code. The first and second angle-measuring devices including a common scanning device that includes: 1) a detector array for generating first and second sequences of code words of a predetermined scanning length upon scanning of the closed serial first and second codes, respectively; and 2) a decoding device that decodes the first and second sequences of code words. A second length of the closed serial second code is less than a first length of the closed serial first code, and the closed serial first and second codes comprise a common code section. The first and second sequences of code words include first and second partial sequences, respectively, wherein each of the first and second sequences include a common partial sequence, wherein the common partial sequence is created upon the scanning device scanning the common code section. The closed serial first and second codes and the predetermined scanning length are all selected such that code words of the first and second sequences of code words each have a Hamming distance greater than 1.

In the present invention, to achieve standardization, the assumption is not a single sequence of code words, but instead one common code. Thus the present invention is based on the recognition that already by the use of a common code, standardization can be achieved by simple provisions. The sequence of code words that is generated in scanning the common code can be decoded by a common set of values, hereinafter called the first set of values. The complete sequences, generated in the scanning, of code words of two angle-measuring devices of the line formed by the standardization differ, however, in the other regions (first partial sequence and second partial sequence). It is thus possible, from a long code of an angle-measuring device of large diameter, to adopt a section of this code for a small code of an angle-measuring device of smaller diameter. The two sequences of code words that are created upon scanning of the long code and the shorter code now both contain a common sequence section, created from the common code section. The sequence of code words that is created by scanning the closed long code moreover contains a further sequence section (first partial sequence), which is decodable by a second set of values. Since the code of the angle-measuring device having the small diameter corresponds to the common code section, new code words (second partial sequence) are created only upon scanning in the cyclically continued region, that is, at the joint, that is the end to end of the common code section. For coding these relatively few new code words, an individual set of values is provided for decoding, which is stored in memory as a third set of values.

By this provision, it is now possible in a simple way, based on a code, to achieve standardization of angle measuring instruments. Moreover, it is also easily possible to select a code and a scanning length so that all the code words to be decoded in the sequences have a Hamming distance greater than 1, which permits error discovery and correction as needed of the code words and thus ensures reliable position ascertainment.

BRIEF DESCRIPTION OF THE DRAWINGS

The present invention will be described in further detail in conjunction with the drawings, in which.

DESCRIPTION OF THE PREFERRED EMBODIMENT(S) OF THE INVENTION

Fundamentals

Figure 1:
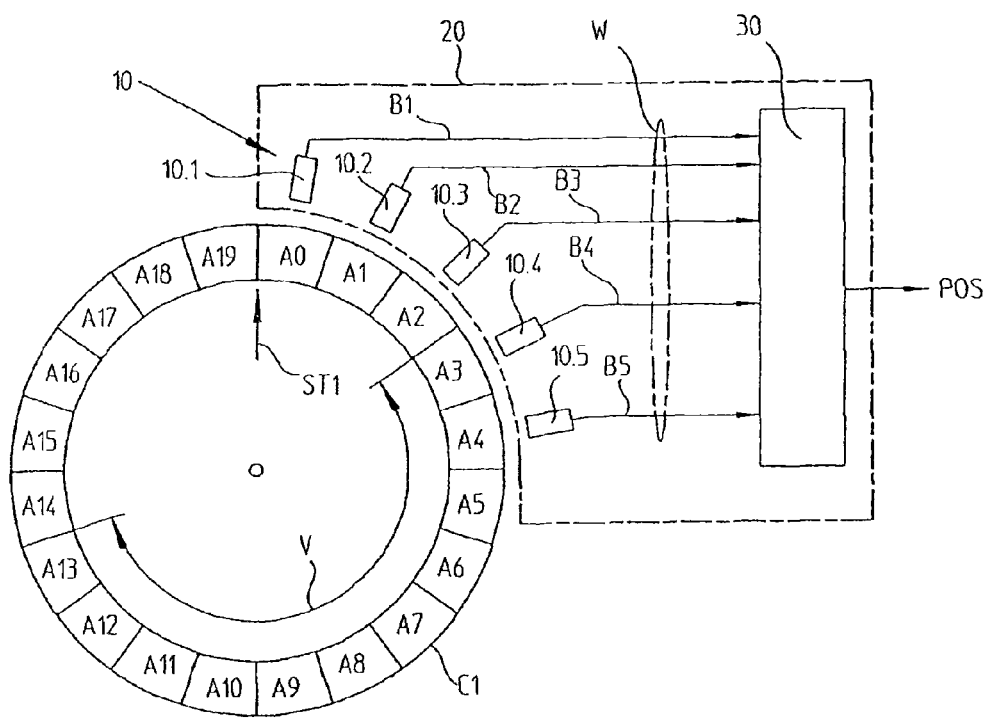
FIG. 1 schematically shows a first embodiment of an angle-measuring device in accordance with the present invention.

In FIG. 1, a first angle-measuring device is shown schematically. This angle-measuring device operates for instance on the optical scanning principle, in which a serial code C1 of a code disk is scanned by the transmitted light method or the incident light method. The serial code C1 includes a successive sequence of code elements A of equal length, here numbered sequentially by the subscripts 0 through 19.

The serial code C1, also called a sequential code, is illuminated by a light source, the light of which illuminates a plurality of successive code elements A simultaneously. The light is modulated by the code C1 as a function of position so that a position-dependent light distribution occurs at the site of a detector array 10. The position-dependent light distribution is converted by the detector array 10 of a scanning device 20 into position-dependent electrical scanning signals B1 through B5.

The detector array 10 is a line sensor, with a sequence, disposed in the measuring direction, of detector elements 10.1 through 10.5. At least one of the detector elements 10.1 through 10.5 is unambiguously assigned to each of the code elements A in each relative position, so that in each relative position of the detector array 10 with respect to the code C1, a respective unambiguous scanning signal B1 through B5 is obtained from each of the code elements A. The sequence of scanning signals B1 through B5 forms one code word W each, and the number of code elements, from which one word W each is composed, is defined as a scanning length $L_A$. The scanning signals B1 through B5, that is, the code word W, are delivered to a decoding device 30 of the scanning device 20, which from them derives an absolute position POS. Upon a shift of the detector array 10 relative to the code C1 by the width or length of one code element A, a new code word W is generated, and across the measuring range to be absolutely measured, many different code words W are formed. These different code words W are provided with subscripts 0 through 1058 in the tables to be explained hereinafter.

As schematically shown in FIG. 1, for determining the absolute position POS, the code words W are delivered to the decoding device 30, in which the decoded code words W are stored in memory. For each of these code words W, in turn, one absolute position POS is stored in memory and thus unambiguously assigned to each code word. The sequence stored in memory of code words W corresponds to the sequence of code words W that can be generated, in a correct mode of operation, by scanning the code C1. The decoding device 30 thus includes a set of values which defines the assignment of code word W to position POS. This set of values is stored in a table of association, hereinafter merely called a table, in which the assignment of code word W to position POS is stored in memory. For associating the absolute position POS with a scanned code word W, or in other words for decoding, the code word W forms the address for the table of association, so that at the output, the position POS associated with that address appears. This decoding is necessary in order to standardize the output. The most usual decoding is conversion into a binary code.

The present invention will be described in further detail hereinafter in conjunction with various angle-measuring devices. The code C1 can be located on a code medium in the form of a code disk, or on a circumferential surface of a drum.

In FIG. 1, a serial code C1 of length $L_1$ is given, wherein $L_1$ is an integer but need not necessarily be equal to a power of two ($2^n$ or $2^n-1$, where n is an integer and $n \geq 2$). The scanning of this serial code C1 is done by the detector elements 10.1 through 10.5 of the detector array 10. This detector array 10 scans a defined number of code elements A and from that generates a bit sequence, which represents the code word W. The number of code elements A from which the code word W is formed is called the scanning length $L_A$. Each position of the code disk having the code C1 in the angle-measuring device is unambiguously coded by a code segment, including $L_A$ code elements A, specifically over the entire measuring range, that is, the circumference, to be detected absolutely.

Let the serial code C1 be defined here by a sequence of code elements $A_i$, where $A_i \in \{0;1\}$ and $i = 0 \ldots (L_1-1)$.

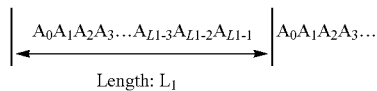
Length: $L_1$

The serial code C1 is either closed or continued cyclically; that is, the beginning of the sequence of code elements A is attached to the end of the sequence of code elements A. Such a system describes arbitrary serial codes for rotary systems. "Overlap" in this connection means the transition from the code end to the code beginning, that is, the transition at the joint; in the example shown in FIG. 1, this is the joint ST1. The overlap is formed by the cyclically continued region of the code C1. Thus, in a circular arrangement of codes C1, for each position, there is one resultant unambiguous successor position for a preceding position.

For decoding in the decoding device 30, a memory is used that is embodied in hard-wired fashion. The decoding device 30 is embodied as an ASIC, and the tables, that is, the memories for the set of values required, are each embodied in hard-wired form, in particular as a logic structure, in the production of the chips. The digitized scanning signals B1 through B5 arriving from the detector array 10 are located on the input lines; that is, actual code word W is presented as a bit pattern. The corresponding position POS is then present at the output in digitized form. The advantage of this kind of hard-wired table is that the position information can be decoded within one time step of the digital hardware. In general, it is possible in the above notation to describe the table in accordance with the Table 1 in the section labeled appendix.

Let the position (third column of Table 1) be called $POS_i$, where $i = 0 \ldots (L_1-1)$. The decoding can then be represented by means of an operator mode of writing. The following equation applies:

$$POS_1 = T(w_i), \text{ where } i = 0 \ldots (L_1-1).$$

The numerical example in accordance with the first angle measuring instrument of FIG. 1 is $L_1 = 20; L_A = 5.$ Serial Code:

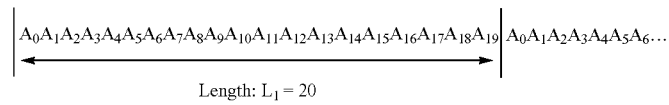
Length: $L_1 = 20$

For this special numerical example, Table 2, as a decoding table, is provided with the set of values shown in it.

For the first angle measuring instrument, hereinafter called "large unit", the code C1 with $L_1$ serial bits is now required on the circumference of the code disk (FIG. 1).

For a second angle measuring instrument, shown in FIG. 2, hereinafter called "small unit", a code C2 with a number $L_2$ of serial bits is required. $L_2 < L_1$ applies. Let the scanning length again be $L_A$. In this general notation, it should be noted that all the subscripts must always be taken as modulo $L_1$. On the precondition that the code elements A in the code C1 and in the code C2 each have the same lengths in the measuring direction, the code medium (disk or drum) for the code C1 has a larger diameter than the code medium for the code C2, which is why the terms "small unit" and "large unit" are used hereinafter.

The serial code C2 for the "small unit" is a section (labeled V in FIG. 1) of the serial code C1 of the "large unit":

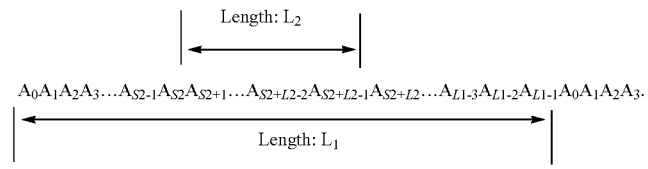

The decoding table for the "small unit" is found in general form in Table 3.

Figure 2:
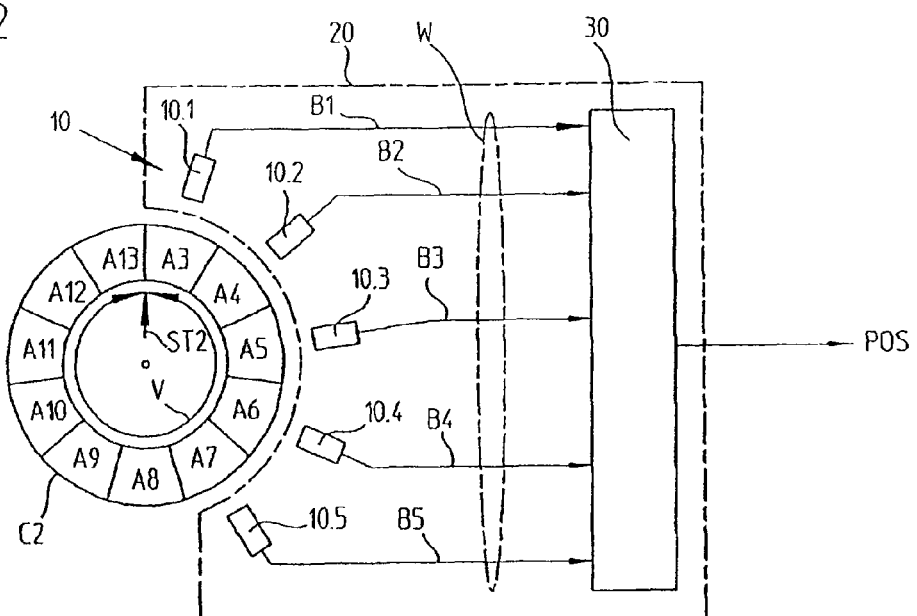
FIG. 2 schematically shows a second embodiment of an angle-measuring device in accordance with the present invention.

The decoding table, for instance for decoding the code C2 of the "small unit" of FIG. 2, is found in Table 4, where $L_2=11$ and $L_A=5$.

The bit sequence of the first code C1 (where $L_1=20$) and the second code C2 (where $L_2=11$), shown graphically:

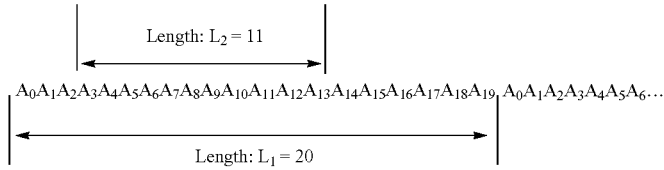

From this illustration and from Table 2 for the first sequence of code words W, that is, the code C1, and from Table 4 for the second sequence of code words W, that is, the code C2, it can be seen that identical words W occur in both Tables 2 and 4. The second sequence of code words W is shifted by three bits compared to the first sequence of code words, and thus is shifted three code words W, so that in this example, $S_2=3$ is to be taken into account as a shift value in the decoding, as will be explained in detail later on. For arbitrary sections V, the serial code C2 of the small unit begins at the point $S_2$, where $0 \leq S_2 \leq L_1-1$.

In Table 4, a comparison of the complete Table 2 of the first angle measuring instrument and the part of Table 4 that is usable from this Table 2 of the second angle measuring instruments is shown. From this, the shift $S_2=3$ of the two identical table parts relative to one another can also be seen.

It can be seen that the bit sequences of $(A_3A_4A_5A_6A_7)$ through $(A_9A_{10}A_{11}A_{12}A_{13})$ occur in both Tables 2 and 4. It is true in general that for a given $L_1$, $L_2$, $L_A$ and $S_2$, the words at the positions $S_2 \ldots (S_2+L_2-L_A)$ of Table 2 are identical to the words at the positions $0 \ldots (L_2-L_A)$ of Table 4.

The fundamentals given above apply to all the exemplary embodiments described in further detail hereinafter.

First Exemplary Embodiment

Below, the essence of the present invention will be explained further, in terms of the numerical example explained above. It will be noted once again that for the sake of simplified description, the present invention will be explained throughout with tables. In fact, this defines the set of values, contained in the tables and required for decoding, which can be stored in memory in various ways in the decoding device 30.

As shown in FIGS. 1 and 2, the first code C1 of FIG. 1 and the second code C2 of FIG. 2 accordingly have a common code section V corresponding to bit sequence $A_3A_4 \ldots A_{13}$.

The detector array 10 is designed for generating a first sequence of code words W of the predetermined scanning length $L_A$ upon scanning the closed first code C1. This first sequence includes a first partial sequence and a so-called common partial sequence, and the common partial sequence occurs upon scanning the common code section V. The detector array 10 is also designed for generating a second sequence of code words W of the predetermined scanning length $L_A$ upon scanning the closed second code C2. This second sequence includes both a second partial sequence, hereinafter also called the set of values of the overlapping table, and the common partial sequence; the common partial sequence occurs upon scanning the common code section V. The first code C1 and the second code C2 as well as the scanning length $L_A$ are selected such that the code words W of the first sequence and the code words W of the second sequence have a Hamming distance greater than 1.

The codes C1, C2 and the scanning length $L_A$ are preferably also selected such that the second partial sequence is not a component of the first sequence of code words W.

The decoding device 30 is designed for decoding the first sequence and the second sequence of code words W, in that the decoding device 30 has a first set of values of successive code words W, which set of values is usable for decoding the code words W of the common partial sequence of the first code C1 and of the second code C2; and the decoding device 30 has a second set of values of code words W, and this set of values is usable for decoding the first partial sequence of code words W; and the decoding device 30 has a third set of values of code words W (overlap table), and this set of values is usable for decoding the second partial sequence of code words W.

The present invention makes it possible to avoid the entire second Table 4. This is done by introducing the so-called overlapping table for decoding the code words W newly generated by the joint—marked in FIG. 2 as ST2. This overlapping table, in this numerical example, has the form of Table 5.

In general, for the overlapping table, Table 6 applies.

The overlapping table has in general $L_A-1$ entries, where $x_j=T_6(w_j)$, where $j=(L_2-L_A+1) \ldots (L_2-1)$.

To design the decoding device 30 in an especially space-saving way, the Table 1 and the Table 6 called the overlapping table are present in the scanning device 20. The set of values required for decoding the common partial sequence of the first sequence and of the second sequence is stored in memory only a single time as an overlapping table. The angle measuring instruments in one line access this set of values for decoding this entire partial sequence.

Figure 4:
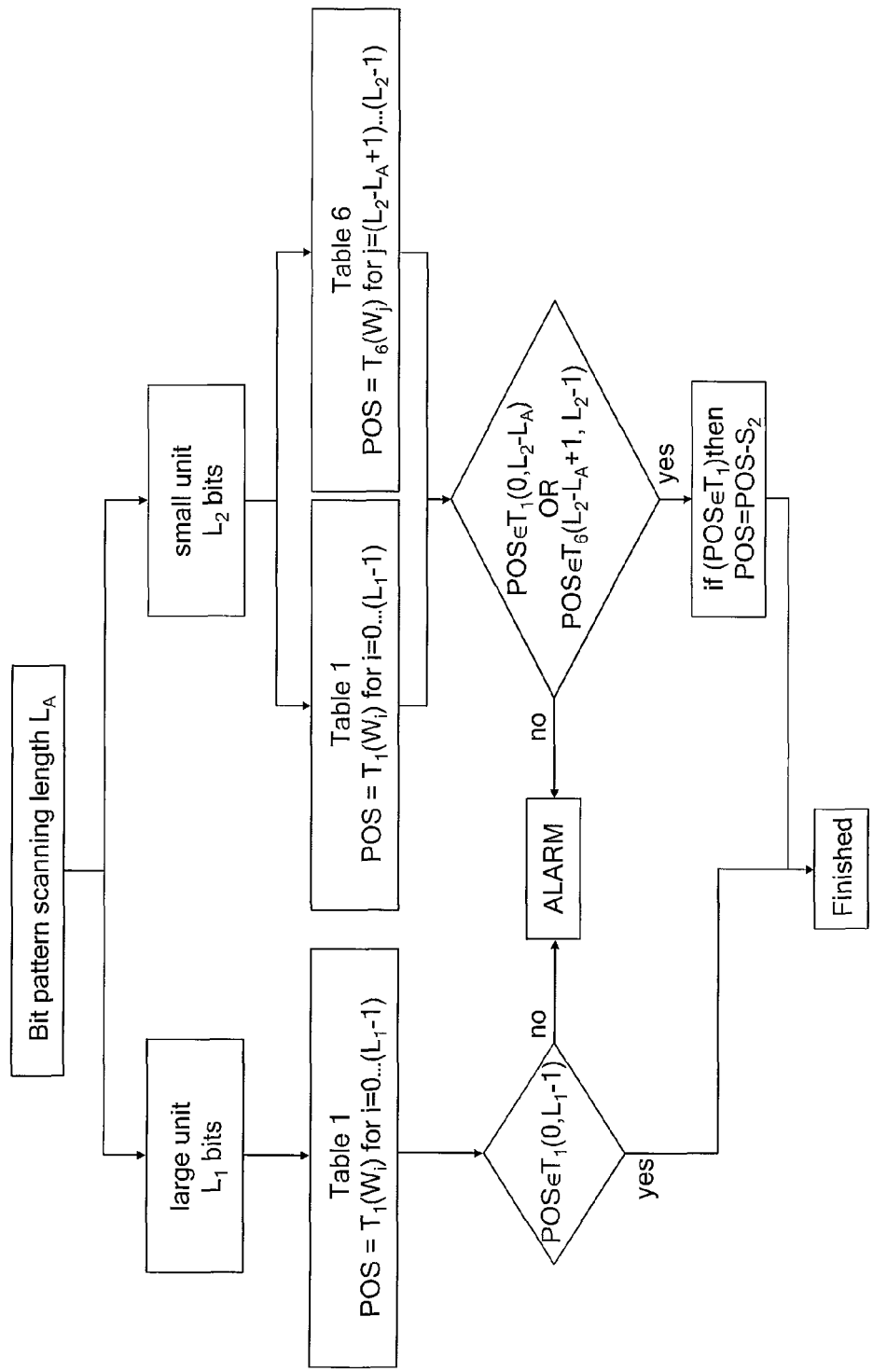
FIG. 4 is a possible flow chart for ascertaining measurement values of the position of a first scanning device for the first and second code disks of the first and second angle-measuring devices of FIGS. 1 and 2.

For the case described here, with two units of different circumference and thus with different bit numbers $L_1$ and $L_2$ as in FIGS. 1 and 2, the result is the flow chart shown in FIG. 4.

Figure 3:
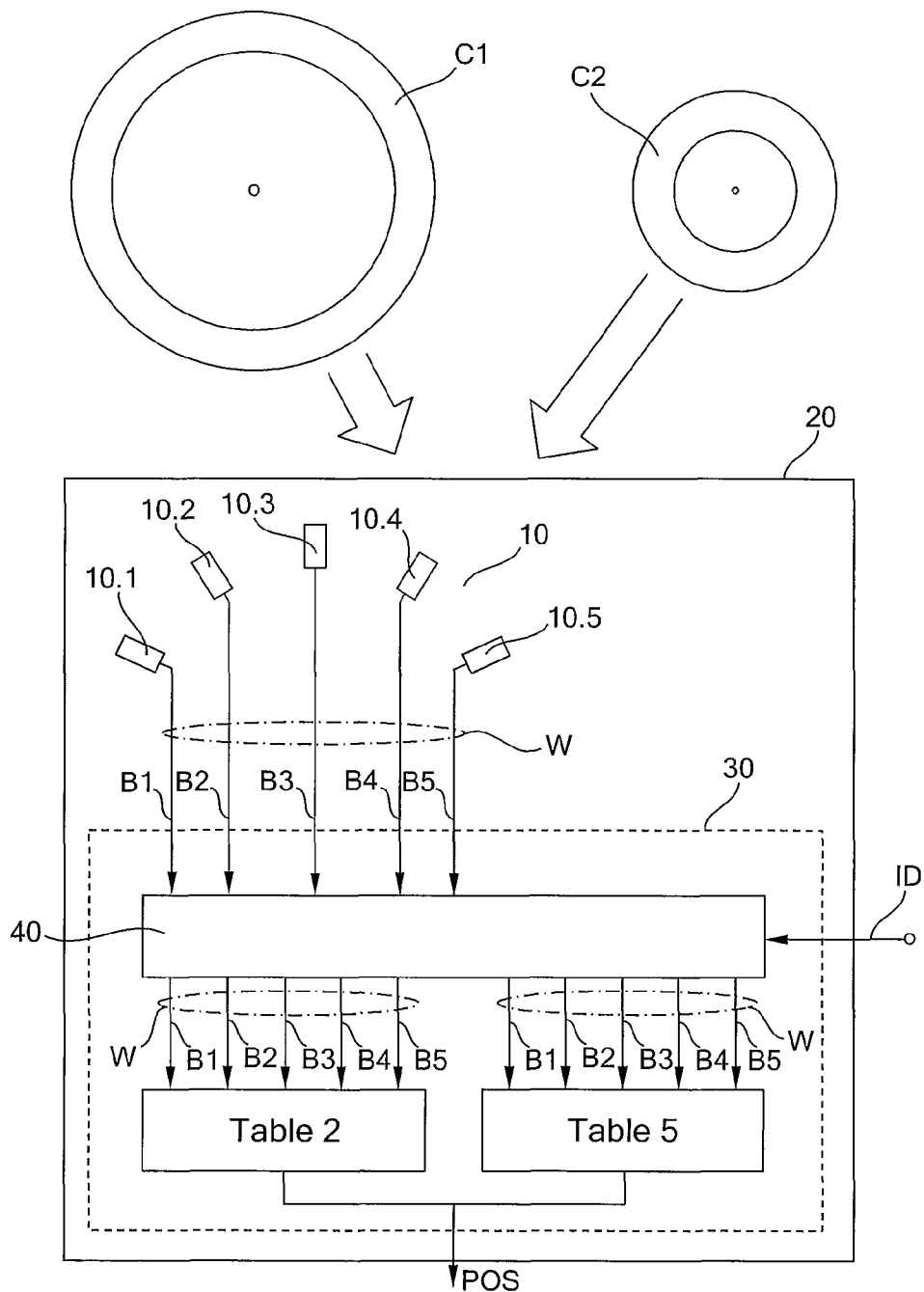
FIG. 3 schematically shows an embodiment of a scanning device to be used with the first and second angle-measuring devices of FIGS. 1 and 2 in accordance with the present invention.

The scanning device 20 shown in FIG. 3 is thus embodied for scanning and evaluating the code C1 of the code disk of FIG. 1 and also for scanning and evaluating the code C2 of the code disk of FIG. 2.

If the scanning device 20 is assigned to the code C1, the left branch of the flow chart in FIG. 4 is executed. This means that the code words W of the first sequence of code words W—that is, of the code C1—that are furnished by the detector array 10 to the decoding device 30 are present in Table 1, and the position POS stored in memory for them is read out. For that purpose, Table 1 contains a complete set of values of successive code words W, which are contained in the first sequence, to be decoded, of code words W—that is, of the code C1.

This set of values in Table 1 includes successive code words W, which are contained in the first sequence, to be decoded, of code words W—that is, of the code C1—and are also contained in common in the second sequence, to be decoded, of code words—that is, of the code C2. The further set of values of Table 1 of successive code words W is contained only in the first sequence to be decoded. If there is no entry for the scanned code word W in Table 1, an alarm is given or an error report is issued.

If the scanning device 20 is assigned to the code C2, the right-hand branch of the flow chart is executed. This means that the code words W of the second sequence of code words W, furnished by the detector array 10 to the decoding device 30, are present in Table 1 and in Table 6. As already mentioned, Table 1 contains a set of values of successive code words W, which are contained in common both in the first sequence, to be decoded, of code words W—that is, in the code C1—and in the second sequence, to be decoded, of code words W—that is, in the code C2. Table 6 (overlap table) has a set of values of successive code words W that are contained only in the second sequence to be decoded, and this set of values finds use for decoding a further section of the second sequence. If no entry for the scanned code word W is found in the corresponding Tables 1 and 6, an alarm is given or an error report is issued.

In this exemplary embodiment, the following condition accordingly applies:

(the set of values for decoding the second sequence)
=(a partial quantity of the set of values for decoding the first sequence, plus the set of values for the overlap).

The code C2 is in its entirety a section V of the code C1, and the set of values for the overlap at the joint ST2 needs to include only the $L_A-1$ in the scanning of newly generated code words W, or in other words needs to contain $L_A-1$ entries.

The flow chart in FIG. 4 relates to the most general case of tables. With respect to the concrete numerical example in FIGS. 1 and 2, the concrete Table 2 should then be used in the flow chart as Table 1, and the concrete Table 5 should be used as Table 6.

It should also be noted that "OR" in the diamond-shaped symbols in this flow chart means an exclusive-OR.

Upon assembly of the applicable angle measuring instrument, it is stored in memory in the scanning device 20 which of the possible units (large or small) the scanning device is installed in and which code C1 or C2 and thus which code disk is associated with the scanning device 20. This storage in memory is shown schematically in FIG. 3 in that the identification ID is predetermined, for instance input, to the decoding device 30. The identification ID indicates that position values POS decoded in the large unit (length: $L_1$ bits) must be used from Table 1 (or in the concrete example from Table 2); and that position values POS decoded in the small unit (length: $L_2$ bits) must be used from both Table 1, since in any case only in the possible region $0 \ldots (L_2-L_A)$, or in the concrete example from Table 2, and also from Table 6 (or in the concrete example from Table 5).

Thus the decoding device 30 can be operated in a first or a second mode of operation as a function of the identification ID, which defines the two sequences to be decoded—that is, the code words of the code C1 and of the code C2—differently from one another. In the first mode of operation, the scanning device 20 has the code C1 of the "large unit" available for scanning, and the sequence of code words W that is obtained from scanning the code C1 is decoded by the decoding device 30, because this first sequence of code words W is decodable by the first decoding table T2. In the second mode of operation, the code C2 of the "small unit" is available to the scanning device 20 for scanning, and the sequence of code words W that is obtained by scanning is again decoded by the decoding device 30, because a section of the second sequence, that is, the section that is generated by the scanning of the section V, is decodable by the first decoding table T2, and a further section is decodable by the second decoding table T5. To that end, a selector device 40 (shown in FIG. 3) is made available, which as a function of the identification ID in the first mode of operation for decoding the first decoding table T2 and in the second mode of operation for decoding the first decoding table T2 and the second decoding table T5, that is, the overlapping table.

The organization of the tables is done such that the set of values that decodes the overlap can be separately triggered and selected for decoding.

In the decoding, furthermore the mutual shift of the common set of values employed should optionally also be taken into account. This is shown at the end of the right-hand branch of the flow chart in FIG. 4. In the case of the concrete numerical example there is a shift of 3 bits, for decoding the second sequence of code words W by the common set of values from Table 2, the position POS ascertained from Table 2 must be corrected, namely POS=POS−3, or in general, POS=POS−$S_2$. This shift value $S_2$ is stored in memory in the scanning device 20 as a function of the identification ID.

The positions that are output by the decoding table T2, which contains the first set of values, are accordingly corrected, in one of the two modes of operation, by the predetermined value $S_2$.

It should be noted that the position POS should be interpreted as a standardized value; that is, POS indicates the position number. In the "small unit", POS=2 for instance means the second position of eleven possible positions over a predetermined measuring range, and in the "large unit", POS=2 means the second position of twenty possible positions over a predetermined measuring range. If the measuring range is one revolution, that is, 360°, then in the "small unit", POS=2=2×360°/11=65.45°, and in the "large unit", POS=2=2×360°/20=36°. This should also be taken into account in the subsequent exemplary embodiments.

In summary, the angle measuring instrument in the first exemplary embodiment accordingly has a scanning device 20, with which the scanning of at least one cyclically continued first serial code C1 and the scanning of at least one cyclically continued second serial code C2 are made possible, and the serial codes C1, C2 have different lengths and an identical section V of successive code elements A. For that purpose, the scanning device 20 has the following components:

a detector array 10 for generating a sequence of code words W of a predetermined scanning length $L_A$, in the scanning of one of the serial codes C1 or C2;

a decoding device 30 for decoding the sequence, obtained from the scanning, of code words W and for outputting decoded words as a position POS, the decoding device 30 being designed to decode the first sequence, obtained by scanning the cyclically continued first serial code C1, of code words W and the second sequence, obtained by scanning the cyclically continued second serial code C2, of code words W, and the decoding device 30 has a first set of values of successive code words W, which set of values is contained in common in at least the first and the second sequence to be decoded, and this set of values is usable for decoding the code words W that are obtained in the scanning of the identical section V of both the first serial code C1 and the second serial code C2.

It is advantageous, as explained in terms of the above numerical example, if the decoding device 30 has at least one second set of values of code words W, this set of values being usable for decoding a further section (first partial sequence) of the first sequence of code words W; and the decoding device 30 has at least one third set of values of code words W, and this set of values is usable for decoding a further section (third partial sequence) of the second sequence of code words W.

It is further advantageous if the second serial code C2 is formed entirely by the identical section V, and the third set of values has a number $L_A-1$ of code words W which are newly generated upon scanning via the joint ST2 of the cyclically continued serial second code C2 as an overlap.

It is also advantageous if the decoding device 30 can be operated in a first or a second mode of operation as a function of an identification ID, which defines the sequences, to be decoded, of code words W distinguishably from one another, and in the first mode of operation the first sequence of code words W is decodable by the first set of values and the second set of values, and in the second mode of operation, the second sequence of code words W is decodable by the first set of values and the third set of values.

To that end, it is appropriate if the set of values decoding the overlap is separately triggerable and selectable for decoding.

This embodiment, which is that the large Table 2 contains the entire set of values of the "large unit", and of it only a part is also used for decoding the "small unit", is of particular advantage in the generation of the serial code for both units. A code C1 needs to be optimized only once for the "large unit"; then for the "small unit", the section V of this optimized code C1 is used and is joined together at the joint ST2. The sole adaptation necessary is that the "overlap" table T5 newly added at the joint be created, with ($L_A-1$) entries. The prerequisite for this especially advantageous provision is that the second code C2 is formed entirely by the section V of the first code C1.

The code C1, the section V, and the scanning length $L_A$ are optimized in such a way that all the code words W, generated in the scanning, of the large and small unit have a Hamming distance greater than 1.

To achieve this, the second partial sequence of code words W is advantageously not a component of the first sequence of code words W.

One example of such a code C1 with a Hamming distance=2 where $L_1$: length of the code=20 (large unit)
$L_A$: scanning length=7
Bit sequence: 10101100110000110110
The corresponding decoding table is Table 21.

From this code C1, the code C2 of a small unit can be derived, in that the section V, for instance, comprising the first 11 bits of the code C1, is adopted:

$L_2$: length of the code=11
$L_A$: scanning length=7
Bit sequence: 10101100110
The corresponding decoding table is Table 22.

Second Exemplary Embodiment

Below, an alternative embodiment will be explained, which is advantageous if one wishes to avoid placing a large table on an ASIC. This alternative version uses smaller tables. This can be seen most clearly in the exemplary embodiment having the two codes C1 and C2.

Once again, a serial code C1 where $L_1$=20 and $L_A$=5 is given. Further, let $L_2$=11 and $S_2$=3. The serial code C1 is then:

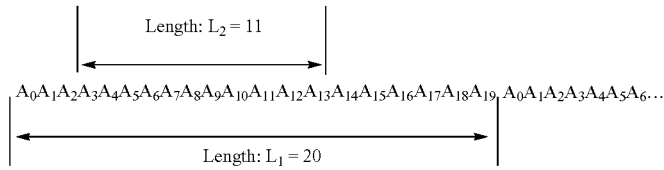

The first sequence of code words, that is, Table 2, is now broken down into three tables, namely into Table 7, Table 8, and Table 9 ($T_{N1}$–$T_{N3}$) and the overlapping table, Table 6 ($T_6$), with the second partial sequence as the set of values is now generated, as in the first exemplary embodiment. The set of values stored in memory in Table 7 and in Table 9 represents the first partial sequence of the first sequence, and Table 8 represents the common partial sequence.

Figure 5:
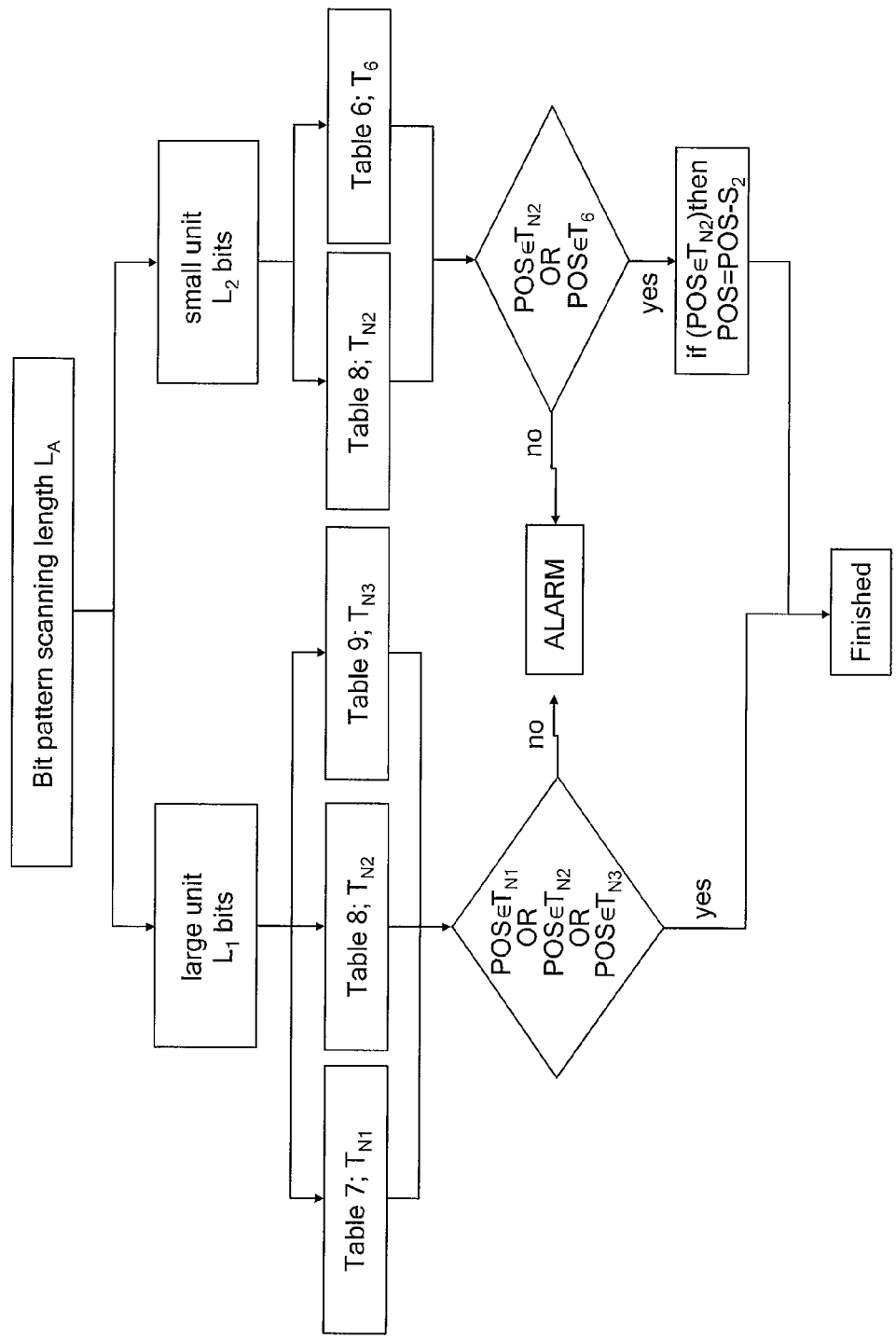
FIG. 5 is a possible flow chart for ascertaining measurement values of the position of a second embodiment of a scanning device for the first and second code disks of the first and second angle-measuring devices of FIGS. 1 and 2.

The associated flow chart is shown in FIG. 5.

In this case, the decoding of the bit pattern in the large unit is done on the basis of the three Tables 7, 8 and, 9 ($T_{N1}$, $T_{N2}$, and $T_{N3}$). In the small unit, a search must be made in both the small Table 8 ($T_{N2}$) and the Table 6 ($T_6$). In the case of the "small unit", the mutual shift of the tables must also be taken into account, so that the value $S_2$ (in the above example: $S_2$=3) must also be subtracted from POS, if POS was found in $T_{N2}$.

In principle, this is the same as in the first exemplary embodiment, because the tables $T_{N1}$, $T_{N2}$, and $T_{N3}$ contain the same information as $T_2$. However, this option offers two advantages:

It is easier to synthesize small tables for an ASIC than large ones.

It is more convenient to "store" a plurality of small tables on an ASIC.

It should again be noted that each "OR" in the diamond-shaped symbols in this flow chart is an exclusive-OR.

The decoding device 30 accordingly has a plurality of decoding tables (Table 5, Table 8, and Tables 7 and 9), and one decoding table (Table 8) has the commonly used set of values of the common partial sequence. A further decoding table (Table 5) has the remaining individual set of values of the second partial sequence of the "small unit" and a further decoding table has the remaining individual set of values of the first partial sequence of the "large unit". Portions of the individual sets of values, in particular of the first partial sequence, can once again be split into separate tables (Tables 7 and 9 for the "large unit"), in order to be better able to accommodate them spatially on a chip.

Third Exemplary Embodiment

This method can be repeated for a plurality of tables in the manner corresponding to the example for two tables. For that purpose, the construction of corresponding overlapping tables is all that is necessary, but their size (=the number of entries) is only $L_A-1$. In general, a corresponding number of not necessarily identical constants $S_k$ are then possible, where k=2 ... (number of overlapping tables+1).

The following exemplary embodiment is applicable to four unit sizes, in which
$L_1$=1059,
$L_2$=989,
$L_3$=615,
$L_4$=329.

Let the scanning length be $L_A$=18. Furthermore, $S_2=S_3=S_4=0$.

Figure 6:
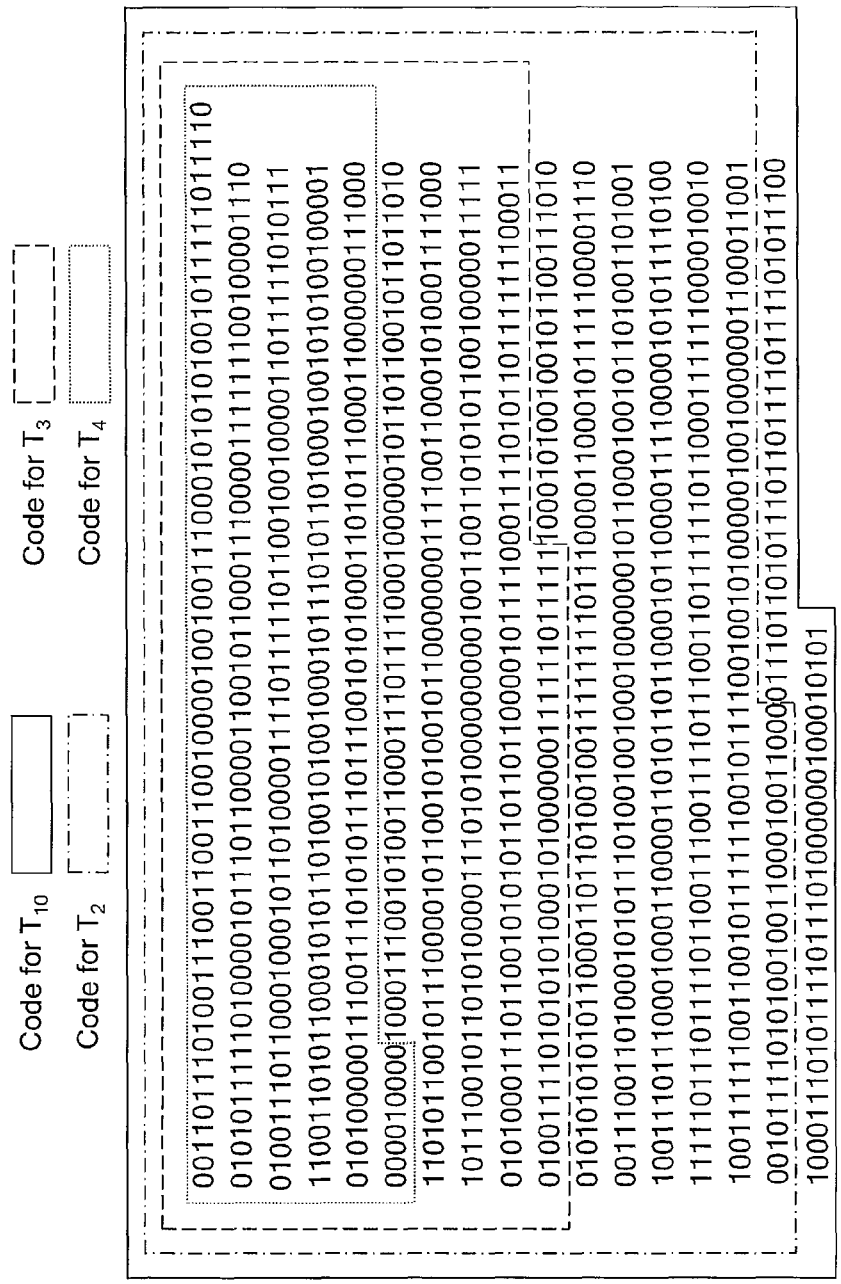
FIG. 6 shows a possible serial code of four additional code disks.

The serial code for this is shown in FIG. 6.

Three overlapping tables (here called $T_{O2}$, $T_{O3}$, and $T_{O4}$) are needed; the number of entries in each of the overlapping tables is $L_A-1=17$. For a scanning length $L_A=18$, the following tables are thus required:

Table 10 ($T_{10}$, Table 11 ($T_{O2}$), Table 12 ($T_{O3}$), and Table 13 ($T_{O4}$).

Figure 7:
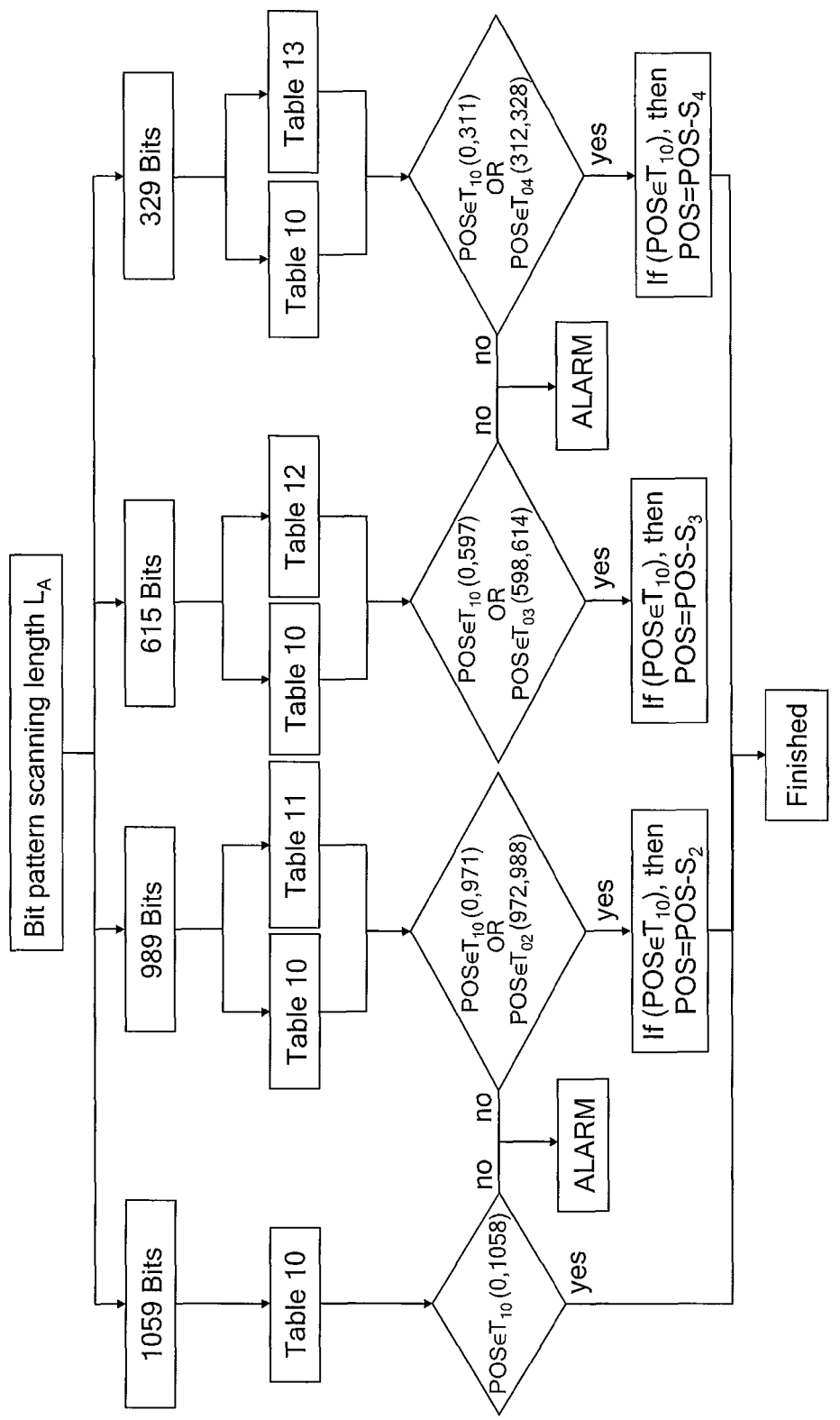
FIG. 7 is a possible flow chart for ascertaining measurement values of the position of a scanning device for the code of the four code disks of FIG. 6.

The flow chart shown in FIG. 7 is now expanded to a total of four branches. In the assembly of the unit, it must be stored in memory in the ASIC which of the four possible units the ASIC is located in. This is preferably done by specifying an identification ID.

In this flow chart, the general Ask
If (POS∈$T_1$), then
POS:=POS-$S_i$,
although in this example, actually $S_i$=0, if i=2, 3, 4.

It should again be noted that the OR in the diamond-shaped symbols in this flow chart are an exclusive-OR.

Fourth Exemplary Embodiment

Here, one further possibility of designing tables for the four code disks will be explained with the code as in FIG. 6. In the alternative illustration, the table $T_{10}$ is now split into four new tables ($T_{N1}$ through $T_{N4}$). In the appendix, these are called Tables 14 through 17.

Figure 8:
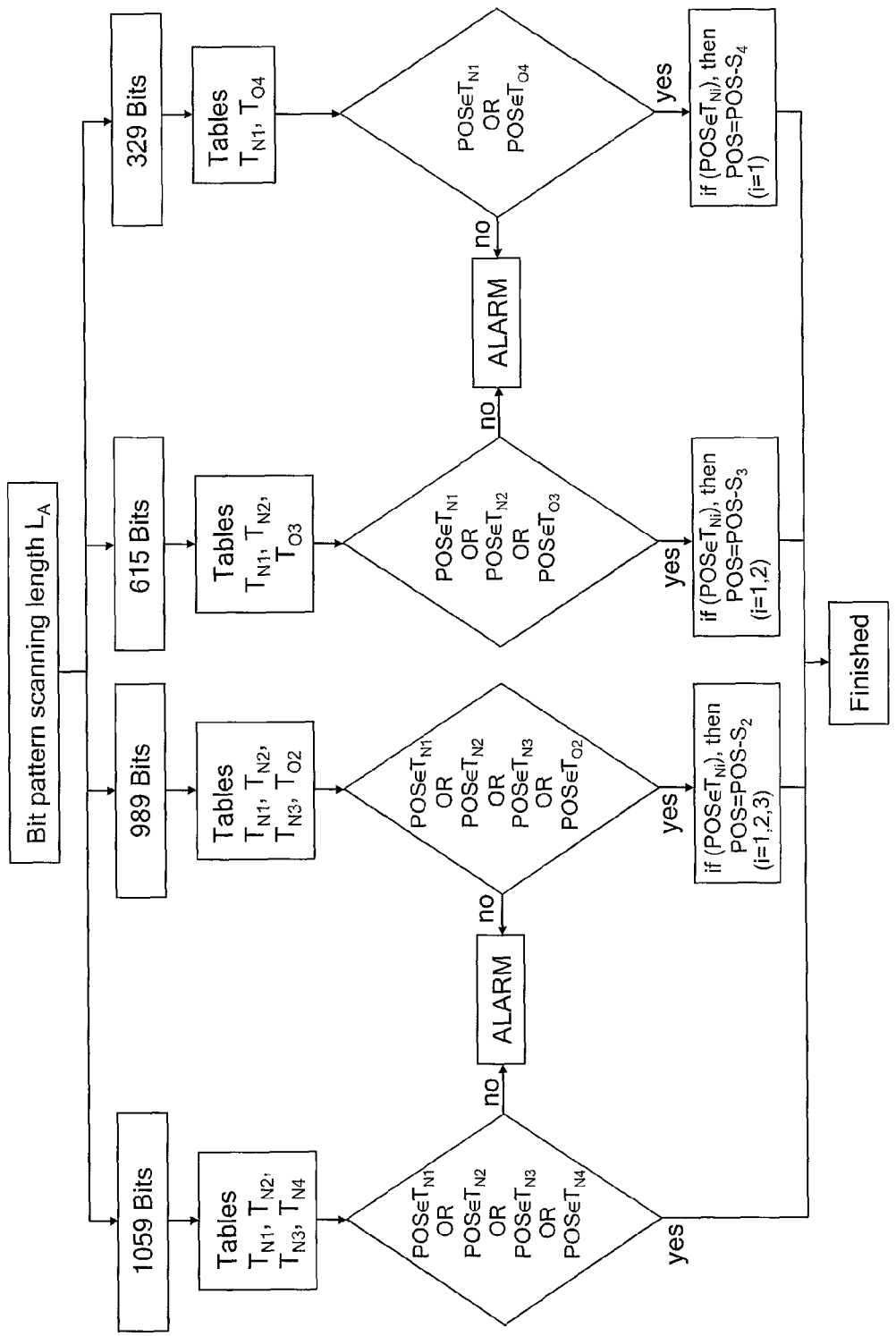
FIG. 8 is a possible further flow chart for ascertaining measurement values of the position of a scanning device for the code of the four code disks of FIG. 6.

The overlapping tables $T_{O2}$ through $T_{O4}$ are again Tables 11 through 13, as described in the third exemplary embodiment. The flow chart with the seven tables used here, that is, Tables 14 through 17 ($T_{N1}$ through $T_{N4}$) and Tables 11 through 13 ($T_{O2}$ through $T_{O4}$), is shown in FIG. 8.

In this flow chart, the general Ask
If (POS∈$T_{ni}$), then
POS:=POS-$S_k$,
although in this example, actually $S_k$=0, if i=2, 3, 4.

It should again be noted that the OR in the diamond-shaped symbols in this flow chart are an exclusive-OR.

Further Possible Embodiments and Generalities

Figure 9:
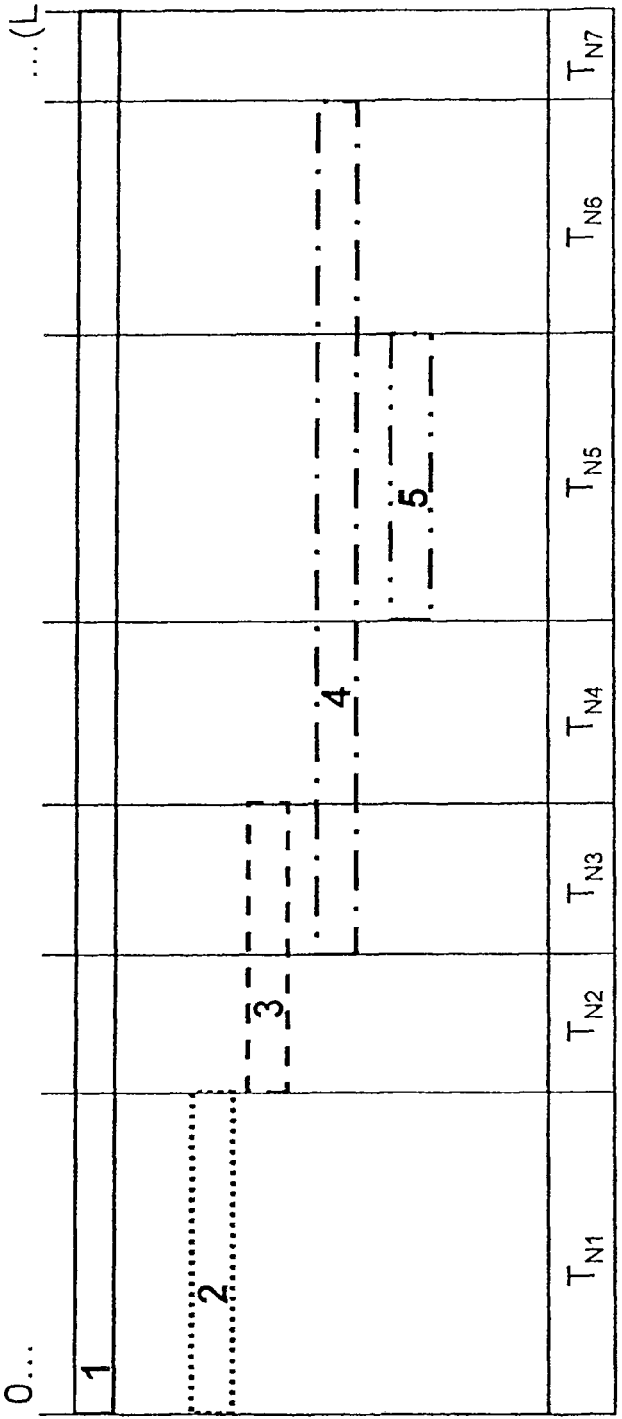
FIG. 9 shows a possible code as well as a possible distribution among a plurality of tables.

Further internesting of codes are conceivable, which will merely be mentioned here. The graph shown in FIG. 9, in schematic form, for example shows a code 1 which contains further partial codes 2 through 5. In accordance with the second and fourth exemplary embodiments, the large table for code 1 can then be split up into seven tables $T_{N1}$ through $T_{N7}$.

Here, $S_2$=0, but $S_3$, $S_4$, $S_5 \ne 0$. In addition to the tables $T_{N1}$ through $T_{N7}$, there are naturally also the corresponding overlapping tables $T_{O2}$, $T_{O3}$, $T_{O4}$, and $T_{O5}$.

Figure 10:
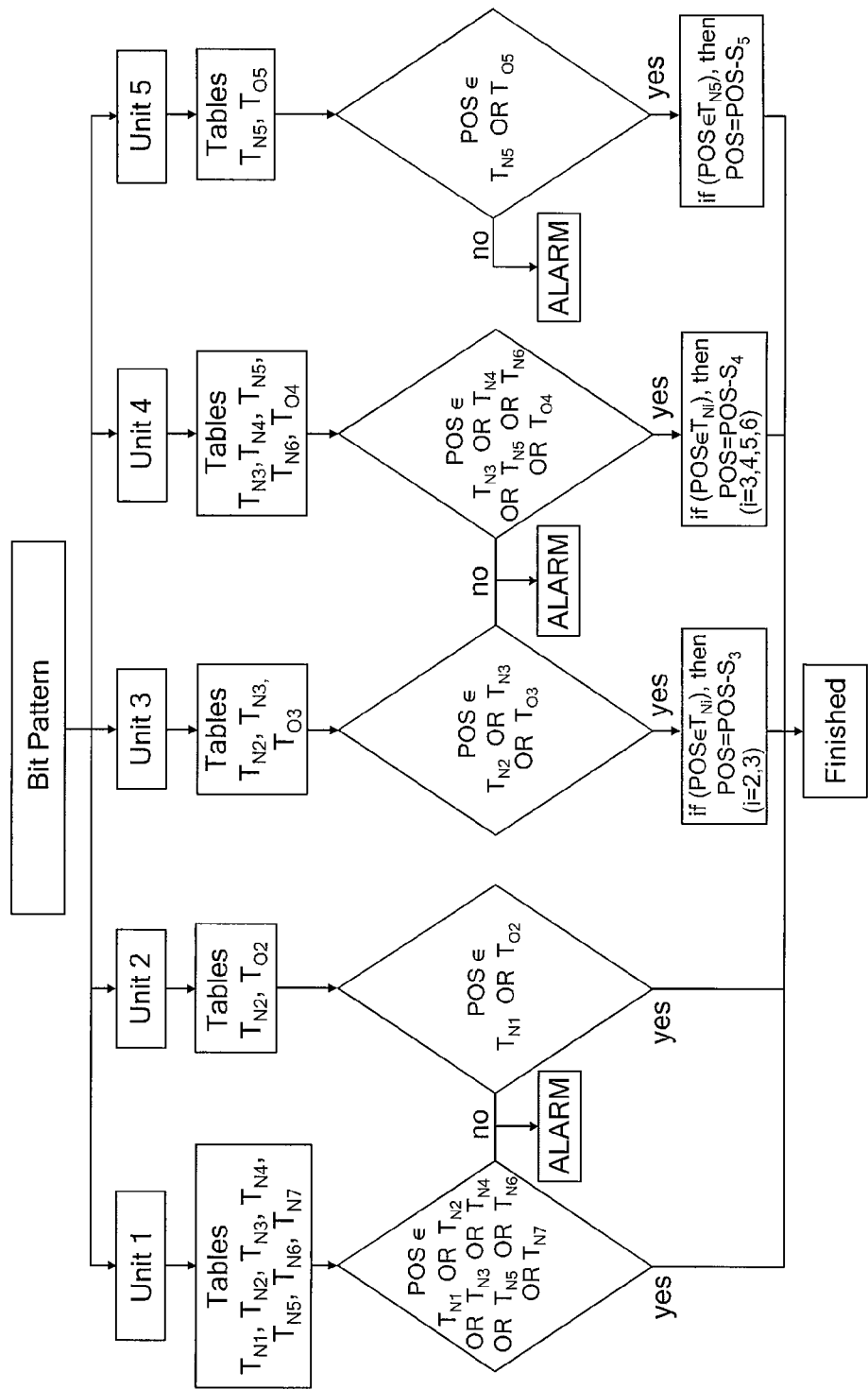
FIG. 10 is a possible flow chart for ascertaining measurement values of the position for the code shown in FIG. 9.

The flow chart for the example shown here is shown in FIG. 10.

Here as well, the OR in the inquiries (diamond-shaped symbols) is again an exclusive-OR.

Figure 11:
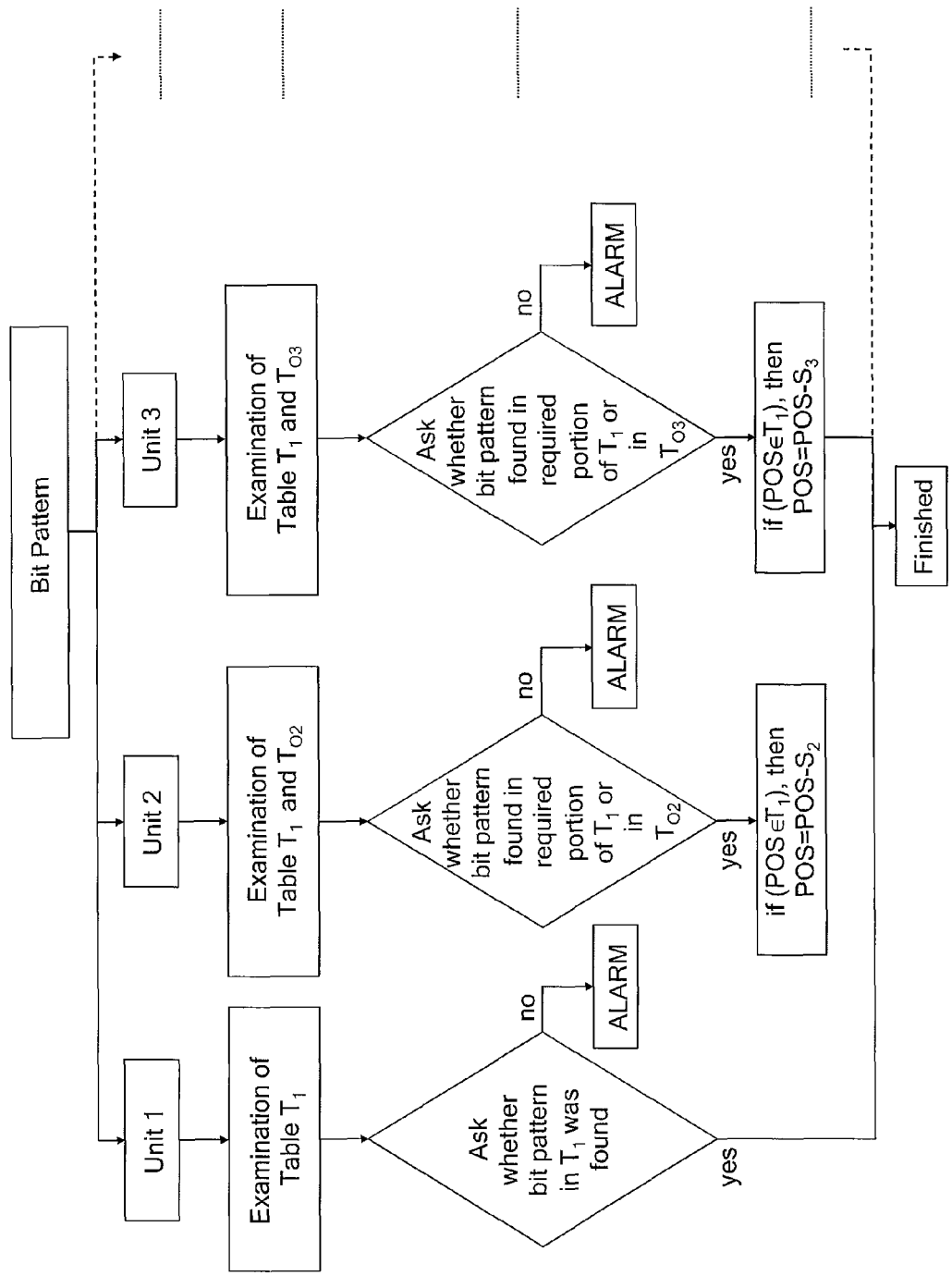
FIG. 11 is a flow chart for ascertaining measurement values of the position in general form.

A flow chart in the most general form in accordance with the first and third exemplary embodiments is shown in FIG. 11.

Figure 12:
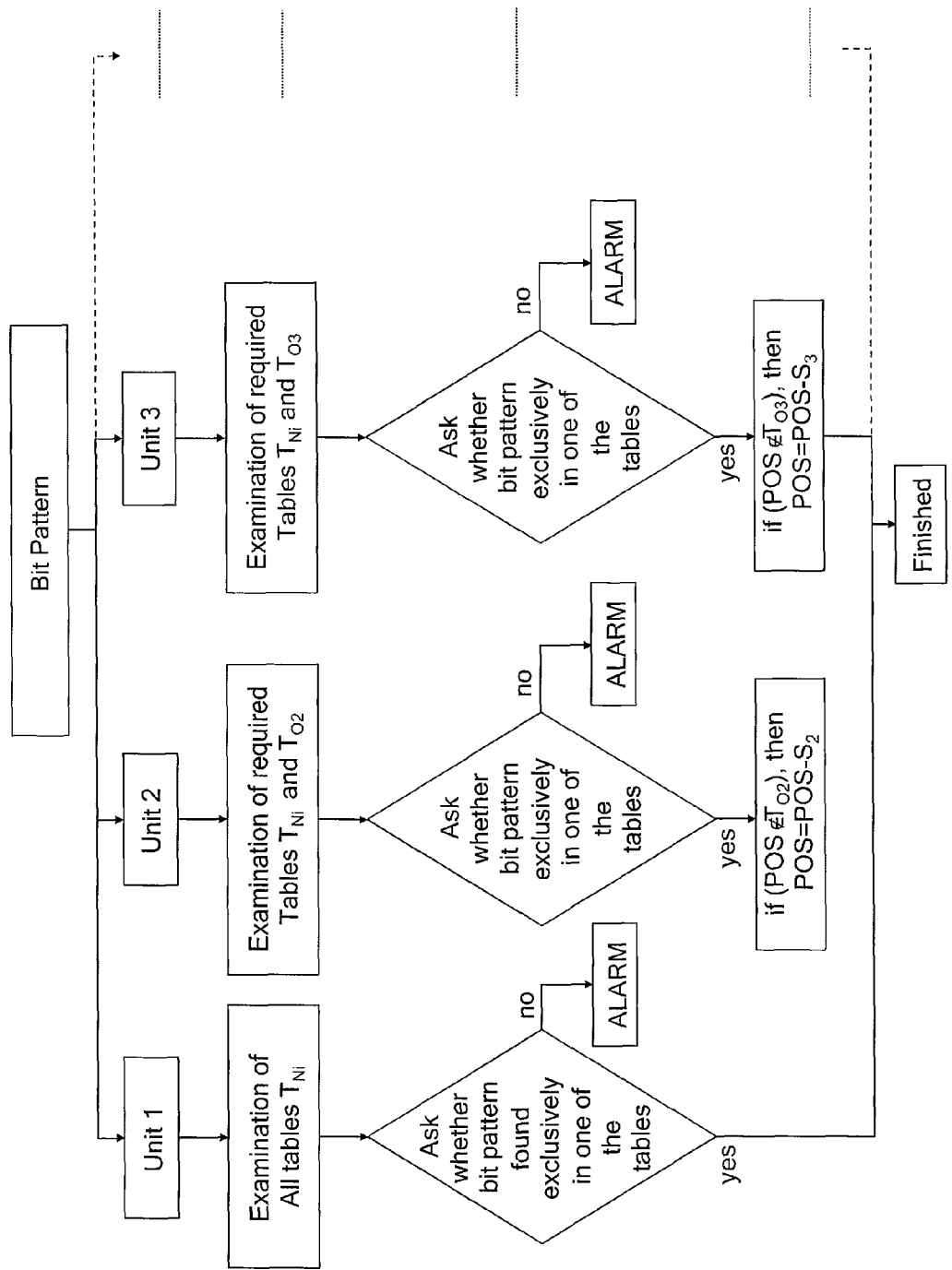
FIG. 12 is a possible further flow chart for ascertaining measurement values of the position in general form.

A flow chart in the most general form in accordance with the second and fourth exemplary embodiments is shown in FIG. 12.

In it, code 1 with table $T_1$ is the largest/longest code, in which the other codes are "contained". Possibly, the "offsets" $S_2$, $S_3$, ... of the partial codes contained, and the corresponding overlapping tables $T_{O2}$, $T_{O3}$, ..., are needed again. In the second and third exemplary embodiments, the table $T_1$ is split up into the tables $T_{N1}$, $T_{N2}$, ....

Instead of adopting only one code section V from the first code C1 for the second code C2, the code C2 can also be formed from a plurality of code sections V1, V2 of the first code C1. In general, it is true that:

the second code C2 is formed of K common code sections V, V1, V2, where K is a natural number equal to or greater than 1, and the third set of values has a number=$K \times (L_A-1)$ code words W, which are generated, where $L_A$=scanning length, in the scanning of the cyclically continued code sections V, V1, V2.

Explained in terms of an example with two code sections V1, V2, and thus K=2:

A code C1 where $L_1$=20 and $L_A$=5 is given. Also, let $L_2$ still equal 13. The decoding table for the first sequence of code words W is again Table 2.

The second code C2 (small code) is put together from two code sections V:

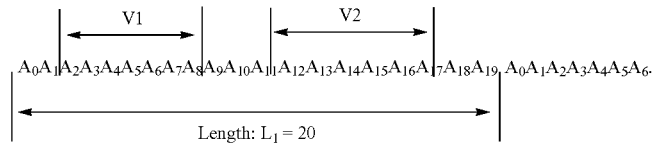

The following is true:

The number K of overlapping tables required=the number K of code sections from the large code. That is: two noncohesive code sections V1 and V2→two overlapping tables.

The set of values required for decoding the small code is shown in Table 18. The sections commonly used in both codes C1, C2, that is, the commonly used partial sequences which form the overlapping tables, are identified by braces. The different sections in the second code, that is, the second partial sequences, are marked in gray. The overlapping tables are shown as Tables 19 and 20.

Accordingly, in decoding, in the flow charts one has to look not only in one but rather in K overlapping tables and also use K "offsets" $S_k$.

It has already been noted that in the unit assembly, which code, C1 or C2, is associated with the scanning device or the ASIC must be stored in memory in the scanning device or the ASIC. Alternatively, on being started up, the scanning device could also automatically detect which unit it is located in from the overlapping region of the code. For that purpose, in a startup mode, a revolution must be recorded by the unit. Only in one of the branches shown in the flow charts is no alarm then issued. This could be automatically detected by the ASIC and after that automatically adjusted/programmed fixedly to this "branch" that does not generate any alarms, or generates the fewest alarms.

As already noted, the decoding device 30 is advantageously embodied as an ASIC, and the tables, that is, the memories for the requisite set of values, are each embodied in hard-wired fashion in the production of the chip. For fast adaptation of the ASIC to new requirements, a different form of memories for the sets of values can also be employed. A mixed form would be especially advantageous, in which on the one hand fast access to the memory data is to be achieved and on the other, fast adaptation to the intended use should be made possible. This is achieved in that a memory that is still programmable after the mass production is provided, and the individually required set of values of the overlap, that is, the third set of values required for decoding the second partial sequence, is stored in memory in this programmable memory. The programmable memory is a read-only memory and is embodied for instance as an EPROM. The set of values for the code C1 that is long enough to cover the largest diameter of a code disk or drum required is embodied in hard-wired form, and the individual set of values, that is, the overlapping table, is stored in memory in the EPROM as a function of the portion V, used for a smaller unit, of code C1; in this case, only ($L_A-1$) entries are necessary. The identification ID as well as optionally other variables, such as the constant $S_k$, can also be stored in memory in this EPROM.

The present invention is especially advantageously usable for the optical scanning principle. In that case, the detector array 10 and the decoding device 30 are advantageously accommodated jointly in a single opto-ASIC.

However, the present invention is not limited to the optical scanning principle, but instead can also be employed with magnetic, inductive, and capacitive scanning principles.

Further embodiment variations of the method and devices in accordance with the present invention of course exist besides the explained examples and embodiments.

APPENDIX

TABLE 1

Sequence of length $L_1$ and scanning length $L_A$
$L_1$: length of the sequence of code words
$L_A$: scanning length

| Bit Pattern (Input of the Table) | Word | Position (Output of the Table) |
|---|---|---|
| $A_0 A_1 A_2 \ldots A_{LA-1}$ | $w_0$ | 0 |
| $A_1 A_2 A_3 \ldots A_{LA}$ | $w_1$ | 1 |
| $A_2 A_3 A_4 \ldots A_{LA+1}$ | $w_2$ | 2 |
| . | . | . |
| . | . | . |
| . | . | . |
| $A_{L1-2} A_{L1-1} A_0 A_1 \ldots A_{LA-3}$ | $w_{L1-2}$ | $L_1 - 2$ |
| $A_{L1-1} A_0 A_1 A_2 \ldots A_{LA-2}$ | $w_{L1-1}$ | $L_1 - 1$ |

TABLE 2

Sequence of length $L_1 = 20$ and scanning length $L_A = 5$
$L_1$: length of the sequence of code words
$L_A$: scanning length

| Bit Pattern | Word | Position |
|---|---|---|
| $A_0 A_1 A_2 A_3 A_4$ | $w_0$ | 0 |
| $A_1 A_2 A_3 A_4 A_5$ | $w_1$ | 1 |
| $A_2 A_3 A_4 A_5 A_6$ | $w_2$ | 2 |
| $A_3 A_4 A_5 A_6 A_7$ | $w_3$ | 3 |
| $A_4 A_5 A_6 A_7 A_8$ | $w_4$ | 4 |
| $A_5 A_6 A_7 A_8 A_9$ | $w_5$ | 5 |
| $A_6 A_7 A_8 A_9 A_{10}$ | $w_6$ | 6 |
| $A_7 A_8 A_9 A_{10} A_{11}$ | $w_7$ | 7 |
| $A_8 A_9 A_{10} A_{11} A_{12}$ | $w_8$ | 8 |
| $A_9 A_{10} A_{11} A_{12} A_{13}$ | $w_9$ | 9 |
| $A_{10} A_{11} A_{12} A_{13} A_{14}$ | $w_{10}$ | 10 |
| $A_{11} A_{12} A_{13} A_{14} A_{15}$ | $w_{11}$ | 11 |
| $A_{12} A_{13} A_{14} A_{15} A_{16}$ | $w_{12}$ | 12 |
| $A_{13} A_{14} A_{15} A_{16} A_{17}$ | $w_{13}$ | 13 |
| $A_{14} A_{15} A_{16} A_{17} A_{18}$ | $w_{14}$ | 14 |
| $A_{15} A_{16} A_{17} A_{18} A_{19}$ | $w_{15}$ | 15 |
| $A_{16} A_{17} A_{18} A_{19} A_0$ | $w_{16}$ | 16 |
| $A_{17} A_{18} A_{19} A_0 A_1$ | $w_{17}$ | 17 |
| $A_{18} A_{19} A_0 A_1 A_2$ | $w_{18}$ | 18 |
| $A_{19} A_0 A_1 A_2 A_3$ | $w_{19}$ | 19 |

TABLE 3

Sequence of length $L_2$ and scanning length $L_A$
$L_2$: length of the sequence of code words
$L_A$: scanning length

| Bit Pattern | Word | Position |
|---|---|---|
| $A_{S2} A_{S2+1} A_{S2+2} \ldots A_{S2+LA-1}$ | $w_0$ | 0 |
| $A_{S2+1} A_{S2+2} A_{S2+3} \ldots A_{S2+LA}$ | $w_1$ | 1 |
| $A_{S2+2} A_{S2+3} A_{S2+4} \ldots A_{S2+LA+1}$ | $w_2$ | 2 |
| . | . | . |
| . | . | . |
| . | . | . |
| $A_{S2+L2-2} A_{S2+L2-1} A_{S2} A_{S2+1} \ldots A_{S2+LA-3}$ | $w_{L2-2}$ | $L_2 - 2$ |
| $A_{S2+L2-1} A_{S2} A_{S2+1} A_{S2+2} \ldots A_{S2+LA-2}$ | $w_{L2-1}$ | $L_2 - 1$ |

TABLE 4

Sequence of length $L_2 = 11$ and scanning length $L_A = 5$
$L_2$: length of the sequence of code words
$L_A$: scanning length

| Bit Pattern | Word | Position |
|---|---|---|
| $A_3 A_4 A_5 A_6 A_7$ | $w_0$ | 0 |
| $A_4 A_5 A_6 A_7 A_8$ | $w_1$ | 1 |
| $A_5 A_6 A_7 A_8 A_9$ | $w_2$ | 2 |
| $A_6 A_7 A_8 A_9 A_{10}$ | $w_3$ | 3 |
| $A_7 A_8 A_9 A_{10} A_{11}$ | $w_4$ | 4 |
| $A_8 A_9 A_{10} A_{11} A_{12}$ | $w_5$ | 5 |
| $A_9 A_{10} A_{11} A_{12} A_{13}$ | $w_6$ | 6 |
| $A_{10} A_{11} A_{12} A_{13} A_3$ | $w_7$ | 7 |
| $A_{11} A_{12} A_{13} A_3 A_4$ | $w_8$ | 8 |
| $A_{12} A_{13} A_3 A_4 A_5$ | $w_9$ | 9 |
| $A_{13} A_3 A_4 A_5 A_6$ | $w_{10}$ | 10 |

Comparison of Table 2 of the first angle measuring instrument and the matching part of Table 4 of the second angle measuring instrument, where $S_2$ = shift of Table 4 compared to Table 2

| | |
|---|---|
| $A_0 A_1 A_2 A_3 A_4$ | 0 |
| $A_1 A_2 A_3 A_4 A_5$ | 1 |
| $A_2 A_3 A_4 A_5 A_6$ | 2 |
| $A_3 A_4 A_5 A_6 A_7$ | 3 |
| $A_4 A_5 A_6 A_7 A_8$ | 4 |
| $A_5 A_6 A_7 A_8 A_9$ | 5 |
| $A_6 A_7 A_8 A_9 A_{10}$ | 6 |

TABLE 4-continued

Sequence of length $L_2 = 11$ and scanning length $L_A = 5$
$L_2$: length of the sequence of code words
$L_A$: scanning length

| | |
|---|---|
| $A_7A_8A_9A_{10}A_{11}$ | 7 |
| $A_8A_9A_{10}A_{11}A_{12}$ | 8 |
| $A_9A_{10}A_{11}A_{12}A_{13}$ | 9 |
| $A_{10}A_{11}A_{12}A_{13}A_{14}$ | 10 |
| $A_{11}A_{12}A_{13}A_{14}A_{15}$ | 11 |
| $A_{12}A_{13}A_{14}A_{15}A_{16}$ | 12 |
| $A_{13}A_{14}A_{15}A_{16}A_{17}$ | 13 |
| $A_{14}A_{15}A_{16}A_{17}A_{18}$ | 14 |
| $A_{15}A_{16}A_{17}A_{18}A_{19}$ | 15 |
| $A_{16}A_{17}A_{18}A_{19}A_0$ | 16 |
| $A_{17}A_{18}A_{19}A_0A_1$ | 17 |
| $A_{18}A_{19}A_0A_1A_2$ | 18 |
| $A_{19}A_0A_1A_2A_3$ | 19 |
| $S_2 = +3$ | |
| $A_3A_4A_5A_6A_7$ | 0 |
| $A_4A_5A_6A_7A_8$ | 1 |
| $A_5A_6A_7A_8A_9$ | 2 |
| $A_6A_7A_8A_9A_{10}$ | 3 |
| $A_7A_8A_9A_{10}A_{11}$ | 4 |
| $A_8A_9A_{10}A_{11}A_{12}$ | 5 |
| $A_9A_{10}A_{11}A_{12}A_{13}$ | 6 |

TABLE 5

Overlapping table of length $L_2 = 11$ and scanning length $L_A = 5$
$L_2$: length of the sequence of code words
$L_A$: scanning length

| Bit Pattern | Word | Position |
|---|---|---|
| $A_{10}A_{11}A_{12}A_{13}A_3$ | $w_7$ | 7 |
| $A_{11}A_{12}A_{13}A_3A_4$ | $w_8$ | 8 |
| $A_{12}A_{13}A_3A_4A_5$ | $w_9$ | 9 |
| $A_{13}A_3A_4A_5A_6$ | $w_{10}$ | 10 |

TABLE 6

Overlapping table in general, where
$L_2$: length of the sequence of code words
$L_A$: scanning length
$S_2$: shift compared to Table 1

| Bit Pattern | Word | Position |
|---|---|---|
| $A_{S2+L2-LA+1}A_{S2+L2-LA+2} \ldots A_{S2+L2-1}A_{S2}$ | $w_{L2-LA+1}$ | $L_2 - L_A + 1$ |
| $A_{S2+L2-LA+2}A_{S2+L2-LA+3} \ldots A_{S2}A_{S2+1}$ | $w_{L2-LA+2}$ | $L_2 - L_A + 2$ |
| . | . | . |
| . | . | . |
| . | . | . |
| $A_{S2+L2-2}A_{S2+L2-1}A_{S2}A_{S2+1} \ldots A_{S2+LA-1}$ | $w_{L2-2}$ | $L_2 - 2$ |
| $A_{S2+L2-1}A_{S2}A_{S2+1}A_{S2+2} \ldots A_{S2+LA-2}$ | $w_{L2-1}$ | $L_2 - 1$ |

TABLE 7

| Bit Pattern | Word | Position |
|---|---|---|
| $A_0A_1A_2A_3A_4$ | $w_0$ | 0 |
| $A_1A_2A_3A_4A_5$ | $w_1$ | 1 |
| $A_2A_3A_4A_5A_6$ | $w_2$ | 2 |

TABLE 8

| Bit Pattern | Word | Position |
|---|---|---|
| $A_3A_4A_5A_6A_7$ | $w_3$ | 3 |
| $A_4A_5A_6A_7A_8$ | $w_4$ | 4 |

TABLE 8-continued

| Bit Pattern | Word | Position |
|---|---|---|
| $A_5A_6A_7A_8A_9$ | $w_5$ | 5 |
| $A_6A_7A_8A_9A_{10}$ | $w_6$ | 6 |
| $A_7A_8A_9A_{10}A_{11}$ | $w_7$ | 7 |
| $A_8A_9A_{10}A_{11}A_{12}$ | $w_8$ | 8 |
| $A_9A_{10}A_{11}A_{12}A_{13}$ | $w_9$ | 9 |

TABLE 9

| Bit Pattern | Word | Position |
|---|---|---|
| $A_{10}A_{11}A_{12}A_{13}A_{14}$ | $w_{10}$ | 10 |
| $A_{11}A_{12}A_{13}A_{14}A_{15}$ | $w_{11}$ | 11 |
| $A_{12}A_{13}A_{14}A_{15}A_{16}$ | $w_{12}$ | 12 |
| $A_{13}A_{14}A_{15}A_{16}A_{17}$ | $w_{13}$ | 13 |
| $A_{14}A_{15}A_{16}A_{17}A_{18}$ | $w_{14}$ | 14 |
| $A_{15}A_{16}A_{17}A_{18}A_{19}$ | $w_{15}$ | 15 |
| $A_{16}A_{17}A_{18}A_{19}A_0$ | $w_{16}$ | 16 |
| $A_{17}A_{18}A_{19}A_0A_1$ | $w_{17}$ | 17 |
| $A_{18}A_{19}A_0A_1A_2$ | $w_{18}$ | 18 |
| $A_{19}A_0A_1A_2A_3$ | $w_{19}$ | 19 |

TABLE 10 for positions 0 . . . 1058

| Bit Pattern | Word | Position |
|---|---|---|
| 001101110100111001 | $w_0$ | 0 |
| 011011101001110011 | $w_1$ | 1 |
| 110111010011100110 | $w_2$ | 2 |
| . | . | . |
| 101001101110100111 | $w_{1056}$ | 1056 |
| 010011011101001110 | $w_{1057}$ | 1057 |
| 100110111010011100 | $w_{1058}$ | 1058 |

TABLE 11

Overlapping table for positions 972 . . . 988

| Bit Pattern | Word | Position |
|---|---|---|
| 001001100010011000 | $w_{972}$ | 972 |
| 010011000100110001 | $w_{973}$ | 973 |
| 100110001001100001 | $w_{974}$ | 974 |
| . | . | . |
| 100001101110100111 | $w_{986}$ | 986 |
| 000011011101001110 | $w_{987}$ | 987 |
| 000110111010011100 | $w_{988}$ | 988 |

TABLE 12

Overlapping table for positions 598 . . . 614

| Bit Pattern | Word | Position |
|---|---|---|
| 000000111111011110 | $w_{598}$ | 598 |
| 000001111110111100 | $w_{599}$ | 599 |
| 000011111101111001 | $w_{600}$ | 600 |
| . | . | . |
| 111001101110100111 | $w_{612}$ | 612 |
| 110011011101001110 | $w_{613}$ | 613 |
| 100110111010011100 | $w_{614}$ | 614 |

TABLE 13

| Overlapping table for positions 312 . . . 328 | | |
|---|---|---|
| Bit Pattern | Word | Position |
| 001110000000100000 | $w_{312}$ | 312 |
| 011100000001000000 | $w_{313}$ | 313 |
| 111000000010000001 | $w_{314}$ | 314 |
| . | . | . |
| . | . | . |
| . | . | . |
| 000001101110100111 | $w_{326}$ | 326 |
| 000011011101001110 | $w_{327}$ | 327 |
| 000110111010011100 | $w_{328}$ | 328 |

TABLE 14

| Bit Pattern | Word | Position |
|---|---|---|
| 001101110100111001 | $w_0$ | 0 |
| 011011101001110011 | $w_1$ | 1 |
| 110111010011100110 | $w_2$ | 2 |
| . | . | . |
| . | . | . |
| . | . | . |
| 0000011100000000100 | $w_{309}$ | 309 |
| 0000111000000001000 | $w_{310}$ | 310 |
| 0001110000000010000 | $w_{311}$ | 311 |

TABLE 15

| Bit Pattern | Word | Position |
|---|---|---|
| 001110000000100001 | $w_{312}$ | 312 |
| 011100000001000010 | $w_{313}$ | 313 |
| 111000000010000100 | $w_{314}$ | 314 |
| . | . | . |
| . | . | . |
| . | . | . |
| 101000000111111011 | $w_{595}$ | 595 |
| 010000001111110111 | $w_{596}$ | 596 |
| 100000011111101111 | $w_{597}$ | 597 |

TABLE 16

| Bit Pattern | Word | Position |
|---|---|---|
| 000000111111011111 | $w_{598}$ | 598 |
| 000001111110111111 | $w_{599}$ | 599 |
| 000011111101111110 | $w_{600}$ | 600 |
| . | . | . |
| . | . | . |
| . | . | . |
| 101001001100010011 | $w_{969}$ | 969 |
| 010010011000100110 | $w_{970}$ | 970 |
| 100100110001001100 | $w_{971}$ | 971 |

TABLE 17

| Bit Pattern | Word | Position |
|---|---|---|
| 001001100010011000 | $w_{972}$ | 972 |
| 010011000100110000 | $w_{973}$ | 973 |
| 100110001001100001 | $w_{974}$ | 974 |
| . | . | . |
| . | . | . |
| . | . | . |
| 101001101110100111 | $w_{1056}$ | 1056 |
| 010011011101001110 | $w_{1057}$ | 1057 |
| 100110111010011100 | $w_{1058}$ | 1058 |

Generation of Table 18, with $L_2 = 13$ from Table 1 with $L_1 = 20$:

$L_A = 5$ $L_1$: length of the sequence of code words $L_A$: scanning length

| Bit Pattern | Word | Position |
|---|---|---|
| $A_0A_1A_2A_3A_4$ | $w_0$ | 0 |
| $A_1A_2A_3A_4A_5$ | $w_1$ | 1 |
| $A_2A_3A_4A_5A_6$ | $w_2$ | 2 |
| $A_3A_4A_5A_6A_7$ | $w_3$ | 3 |
| $A_4A_5A_6A_7A_8$ | $w_4$ | 4 |
| $A_5A_6A_7A_8A_9$ | $w_5$ | 5 |
| $A_6A_7A_8A_9A_{10}$ | $w_6$ | 6 |
| $A_7A_8A_9A_{10}A_{11}$ | $w_7$ | 7 |
| $A_8A_9A_{10}A_{11}A_{12}$ | $w_8$ | 8 |
| $A_9A_{10}A_{11}A_{12}A_{13}$ | $w_9$ | 9 |
| $A_{10}A_{11}A_{12}A_{13}A_{14}$ | $w_{10}$ | 10 |
| $A_{11}A_{12}A_{13}A_{14}A_{15}$ | $w_{11}$ | 11 |
| $A_{12}A_{13}A_{14}A_{15}A_{16}$ | $w_{12}$ | 12 |
| $A_{13}A_{14}A_{15}A_{16}A_{17}$ | $w_{13}$ | 13 |
| $A_{14}A_{15}A_{16}A_{17}A_{18}$ | $w_{14}$ | 14 |
| $A_{15}A_{16}A_{17}A_{18}A_{19}$ | $w_{15}$ | 15 |
| $A_{16}A_{17}A_{18}A_{19}A_0$ | $w_{16}$ | 16 |
| $A_{17}A_{18}A_{19}A_0A_1$ | $w_{17}$ | 17 |
| $A_{18}A_{19}A_0A_1A_2$ | $w_{18}$ | 18 |
| $A_{19}A_0A_1A_2A_3$ | $w_{19}$ | 19 |

| Bit Pattern | Word | Position |
|---|---|---|
| $A_2A_3A_4A_5A_6$ | $w_0$ | 0 |
| $A_3A_4A_5A_6A_7$ | $w_1$ | 1 |
| $A_4A_5A_6A_7A_8$ | $w_2$ | 2 |
| $A_5A_6A_7A_8A_{12}$ | $w_3$ | 3 |
| $A_6A_7A_8A_{12}A_{13}$ | $w_4$ | 4 |
| $A_7A_8A_{12}A_{13}A_{14}$ | $w_5$ | 5 |
| $A_8A_{12}A_{13}A_{14}A_{15}$ | $w_6$ | 6 |
| $A_{12}A_{13}A_{14}A_{15}A_{16}$ | $w_7$ | 7 |
| $A_{13}A_{14}A_{15}A_{16}A_{17}$ | $w_8$ | 8 |
| $A_{14}A_{15}A_{16}A_{17}A_2$ | $w_9$ | 9 |
| $A_{15}A_{16}A_{17}A_2A_3$ | $w_{10}$ | 10 |
| $A_{16}A_{17}A_2A_3A_4$ | $w_{11}$ | 11 |
| $A_{17}A_2A_3A_4A_5$ | $w_{12}$ | 12 |

TABLE 19

| Bit Pattern | Word | Position |
|---|---|---|
| $A_5A_6A_7A_8A_{12}$ | $w_3$ | 3 |
| $A_6A_7A_8A_{12}A_{13}$ | $w_4$ | 4 |
| $A_7A_8A_{12}A_{13}A_{14}$ | $w_5$ | 5 |
| $A_8A_{12}A_{13}A_{14}A_{15}$ | $w_6$ | 6 |

TABLE 20

| Bit Pattern | Word | Position |
|---|---|---|
| $A_{14}A_{15}A_{16}A_{17}A_2$ | $w_9$ | 9 |
| $A_{15}A_{16}A_{17}A_2A_3$ | $w_{10}$ | 10 |
| $A_{16}A_{17}A_2A_3A_4$ | $w_{11}$ | 11 |
| $A_{17}A_2A_3A_4A_5$ | $w_{12}$ | 12 |

TABLE 21

Length of the code C1 = 20:
Scanning length = 7
Bit sequence: 10101100110000110110

| Bit Pattern | Position |
| --- | --- |
| 1010110 | 0 |
| 0101100 | 1 |
| 1011001 | 2 |
| 0110011 | 3 |
| 1100110 | 4 |
| 1001100 | 5 |
| 0011000 | 6 |
| 0110000 | 7 |
| 1100001 | 8 |
| 1000011 | 9 |
| 0000110 | 10 |
| 0001101 | 11 |
| 0011011 | 12 |
| 0110110 | 13 |
| 1101101 | 14 |
| 1011010 | 15 |
| 0110101 | 16 |
| 1101010 | 17 |
| 1010101 | 18 |
| 0101011 | 19 |

TABLE 22

Length of the code C2 = 11:
Scanning length = 7
Bit sequence: 10101100110 (the first 11 bits of code C1 are used)

| Bit Pattern | Position |
| --- | --- |
| 1010110 | 0 |
| 0101100 | 1 |
| 1011001 | 2 |
| 0110011 | 3 |
| 1100110 | 4 |
| 1001101 | 5 |
| 0011010 | 6 |
| 0110101 | 7 |
| 1101010 | 8 |
| 1010101 | 9 |
| 0101011 | 10 |

We claim:

1. An angle-measuring device comprising a scanning device with which scanning of a closed serial first code and scanning of a closed serial second code is enabled, wherein a length of said closed serial second code is less than a length of said closed serial first code, and said closed serial first code and said closed serial second code have at least one common code section, said angle-measuring device comprising:
   a detector array for generating: 1) a first sequence of code words of a predetermined scanning length upon scanning of said closed serial first code, wherein said first sequence comprises a first partial sequence and one common partial sequence, and wherein said common partial sequence is created upon scanning of said common code section, and 2) a second sequence of code words of said predetermined scanning length upon scanning of said closed serial second code, wherein said second sequence comprises a second partial sequence and said common partial sequence, and wherein said common partial sequence is created upon scanning of said common code section; and
   a decoding device designed for decoding said first sequence of code words and said second sequence of code words, wherein said closed serial first code and said closed serial second code as well as said predetermined scanning length are selected such that code words of said first sequence and code words of said second sequence have a Hamming distance greater than 1.

2. The angle-measuring device as defined by claim 1, wherein said decoding device comprises:
   a first set of values of successive code words, wherein said first set of values is usable for decoding code words of said common partial sequence of said first code and of said second code;
   a second set of values of code words, wherein said second set of values is usable for decoding said first partial sequence of code words; and
   a third set of values of code words, wherein said third set of values is usable for decoding said second partial sequence of code words.

3. The angle-measuring device as defined by claim 2, wherein said second code is formed of K common code sections, where K=a natural number greater than or equal to 1; and said third set of values has a number equal to K×(LA−1) code words, which are generated upon scanning of the cyclically continued common code sections, where LA=scanning length.

4. The angle-measuring device as defined by claim 3, wherein K=1, and said second serial code is formed entirely by said common code section.

5. The angle-measuring device as defined by claim 2, wherein said first, second and third sets of values are hard-wired in an ASIC.

6. The angle-measuring device as defined by claim 2, wherein said third set of values is stored in a programmable read-only memory, and said first set of values and said second set of values are in hard-wired form.

7. The angle-measuring device as defined by claim 2, wherein during said decoding said first sequence of code words by said decoding device, said first and second sets of values are selected; and
   wherein during said decoding said second sequence of said code words by said decoding device, said first set of values and said third set of values are selected.

8. The angle-measuring device as defined by claim 2, wherein said decoding device can be operated in:
   a first mode of operation as a function of an identification, which defines sequences of code words that are distinguishable from one another and are to be decoded, wherein in said first mode of operation said first sequence of code words is decodable by said first set of values and said second set of values, and
   a second mode of operation as a function of said identification, wherein in said second mode of operation said second sequence of code words is decodable by said first set of values and said third set of values.

9. A line of angle-measuring devices, comprising:
   a first angle-measuring device comprising:
      a first code medium with a closed serial first code; and
      a scanning device that scans said first code medium, wherein said scanning device comprises:
         a detector array for generating a first sequence of code words of a predetermined scanning length upon scanning of said closed serial first code; and
         a decoding device that decodes said first sequence of code words;
   a second angle-measuring device comprising:
      a second code medium with a closed serial second code; and
      said scanning device, wherein said scanning device scans said second code medium, wherein said scanning device generates a second sequence of code words having said predetermined scanning length upon scanning of said closed serial second code and wherein said decoding device decodes said second sequence of code words; and wherein a second length of said closed serial second code is less than a first length of said closed serial first code, and said closed serial first code and said closed serial second code comprise a common code section;

wherein said first sequence of code words comprises a first partial sequence and a common partial sequence, wherein said common partial sequence is created upon said scanning device scanning said common code section;

wherein said second sequence of code words comprises a second partial sequence and said common partial sequence; and wherein said closed serial first code, said closed serial second code and said predetermined scanning length are all selected such that code words of said first sequence of code words and code words of said second sequence of code words each have a Hamming distance greater than 1.

10. The line of angle-measuring devices as defined by claim 9, wherein said decoding device comprises:

a first set of values of successive code words, wherein said first set of values is usable for decoding code words of said common partial sequence of said closed serial code and of said closed serial second code; and a second set of values of code words, wherein said second set of values is usable for decoding said first partial sequence of code words; and a third set of values of code words, wherein said third set of values is usable for decoding said second partial sequence of code words.

11. The line of angle-measuring devices as defined by claim 10, wherein for decoding said first sequence of code words, said first set of values and said second set of values are selected; and for decoding said second sequence of code words, said first set of values and said third set of values are selected.

* * * * *

UNITED STATES PATENT AND TRADEMARK OFFICE
CERTIFICATE OF CORRECTION

PATENT NO. : 8,476,580 B2  Page 1 of 1
APPLICATION NO. : 12/988573
DATED : July 2, 2013
INVENTOR(S) : Mayer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 406 days.

Signed and Sealed this
Eighth Day of September, 2015

Michelle K. Lee
*Director of the United States Patent and Trademark Office*